United States Patent
Oka

(10) Patent No.: US 10,748,945 B2
(45) Date of Patent: Aug. 18, 2020

(54) SOLID-STATE IMAGING DEVICE, METHOD OF DRIVING SOLID-STATE IMAGING DEVICE, AND ELECTRONIC APPARATUS

(71) Applicant: Sony Corporation, Tokyo (JP)

(72) Inventor: Takumi Oka, Kanagawa (JP)

(73) Assignee: Sony Corporation, Tokyo (JP)

( * ) Notice: Subject to any disclaimer, the term of this patent is extended or adjusted under 35 U.S.C. 154(b) by 56 days.

(21) Appl. No.: 16/076,488

(22) PCT Filed: Feb. 3, 2017

(86) PCT No.: PCT/JP2017/003937
§ 371 (c)(1),
(2) Date: Aug. 8, 2018

(87) PCT Pub. No.: WO2017/141727
PCT Pub. Date: Aug. 24, 2017

(65) Prior Publication Data
US 2019/0043900 A1    Feb. 7, 2019

(30) Foreign Application Priority Data
Feb. 18, 2016 (JP) ................ 2016-028828

(51) Int. Cl.
*H04N 5/355* (2011.01)
*H04N 5/374* (2011.01)
(Continued)

(52) U.S. Cl.
CPC .......... *H01L 27/146* (2013.01); *H01L 27/148* (2013.01); *H04N 5/355* (2013.01);
(Continued)

(58) Field of Classification Search
CPC .. H01L 27/148; H04N 5/355; H04N 5/35563; H04N 5/3559; H04N 5/374; H04N 5/37457
See application file for complete search history.

(56) References Cited

U.S. PATENT DOCUMENTS

2010/0328479 A1  12/2010  Sambongi
2013/0256510 A1  10/2013  Lyu
(Continued)

FOREIGN PATENT DOCUMENTS

| JP | 3071891 B2 | 5/2000 |
|---|---|---|
| JP | 2006-253876 A | 9/2006 |
| JP | 4317115 B2 | 5/2009 |
| JP | 2010-283573 A | 12/2010 |
| JP | 2014-204149 A | 10/2014 |
| WO | WO 2016/147885 A1 | 9/2016 |

OTHER PUBLICATIONS

International Search Report and English translation thereof dated May 9, 2017 in connection with International Application No. PCT/JP2017/003937.

(Continued)

*Primary Examiner* — Phat X Cao
(74) *Attorney, Agent, or Firm* — Wolf, Greenfield & Sacks, P.C.

(57) ABSTRACT

A solid-state imaging device is provided that includes a pixel array with unit pixels. Each unit pixel includes, among other things, first and second photoelectric conversion portions; an electric charge accumulating portion that accumulates charges produced by the second photoelectric conversion portion, a counter electrode of the electric charge accumulating portion being connected to a variable voltage power source; and a charge-to-voltage conversion portion. For at least a part of a time period for which charges produced by the second photoelectric conversion portion are accumulated (Continued)

in the electric charge accumulating portion, a drive portion that controls an operation of the unit pixel causes a voltage of the variable voltage power source to be lower than that when a signal based on the charges accumulated in the electric charge accumulating portion is read out.

16 Claims, 29 Drawing Sheets

(51) Int. Cl.
      *H01L 27/148* (2006.01)
      *H01L 27/146* (2006.01)
      *H04N 5/369* (2011.01)
      *H04N 5/3745* (2011.01)
      *H04N 5/372* (2011.01)

(52) U.S. Cl.
      CPC ....... *H04N 5/3559* (2013.01); *H04N 5/35563* (2013.01); *H04N 5/3698* (2013.01); *H04N 5/374* (2013.01); *H04N 5/37213* (2013.01); *H04N 5/37457* (2013.01)

(56) References Cited

U.S. PATENT DOCUMENTS

2016/0127669 A1* 5/2016 Yamazaki ............ H04N 5/3696
                                                      348/300
2018/0241955 A1* 8/2018 Sakano .............. H04N 5/37457

OTHER PUBLICATIONS

International Written Opinion dated May 9, 2017 in connection with International Application No. PCT/JP2017/003937, and English translation thereof.
International Preliminary Report on Patentability dated Aug. 30, 2018 in connection with International Application No. PCT/JP2017/003937, and English translation thereof.
Extended European Search Report dated Oct. 24, 2018 in connection with EP 17752989.8.

\* cited by examiner

SOLID-STATE IMAGING DEVICE, METHOD OF DRIVING SOLID-STATE IMAGING DEVICE, AND ELECTRONIC APPARATUS

CROSS-REFERENCE TO RELATED APPLICATIONS

This application is a U.S. National Stage entry under 35 U.S.C. § 371 of International Application No. PCT/JP2017/003937, filed in the Japan Patent Office on Feb. 3, 2017, which claims priority to Japanese Patent Application No. 2016-028828, filed in the Japan Patent Office on Feb. 18, 2016; each of these applications is incorporated by reference herein in its entirety.

TECHNICAL FIELD

The present technique relates to a solid-state imaging device, a method of driving the solid-state imaging device, and an electronic apparatus, and more particularly to a solid-state imaging device, a method of driving the solid-state imaging device, and an electronic apparatus each of which enables a dynamic range to be expanded.

Heretofore, dynamic range expanding techniques of solid-state imaging devices of various systems have been present.

For example, there is known a time-division system in which photographing is carried out in time division in different sensitivities, and a plurality of images photographed in the time division is synthesized.

In addition, for example, there is known a spatial division system in which light receiving elements having different sensitivities are provided, and a plurality of images which is photographed in the light receiving elements having the different sensitivities is synthesized, thereby expanding a dynamic range (for example, refer to PTL 1 and 2).

Moreover, for example, there is known an intra-pixel memory system in which a memory for accumulating the electric charges overflowing from a photodiode is provided in each of pixels, and an amount of electric charges which can be accumulated for a period of time for one exposure is increased, thereby expanding a dynamic range (for example, refer to PTL 3).

CITATION LIST

Patent Literature

[PTL 1]
  Japanese Patent No. 3071891
[PTL 2]
  JP 2006-253876A
[PTL 3]
  Japanese Patent No. 4317115

SUMMARY

Technical Problem

In the time-division system or the spatial-division system, the number of divisions is increased, thereby enabling the dynamic range to be expanded. On the other hand, however, when the number of divisions is increased, the deterioration of the image quality is caused due to the generation of artifact, the reduction of resolution, or the like.

In addition, in case of the intra-pixel memory system, since the capacity of the memory is limited, there is a limit to the dynamic range which can be expanded.

In the light of the foregoing, the present technique enables a dynamic range of a solid-state imaging device to be expanded without deteriorating an image quality.

Solution to Problem

A solid-state imaging device of a first aspect of the present technique includes a pixel array portion in which a plurality of unit pixels are arranged, and a drive portion configured to control an operation of the unit pixel. The unit pixel includes a first photoelectric conversion portion, a second photoelectric conversion portion a sensitivity of which is lower than that of the first photoelectric conversion portion, an electric charge accumulating portion configured to accumulate electric charges produced by the second photoelectric conversion portion, a counter electrode of the electric charge accumulating portion being connected to a variable voltage power source, a charge-to-voltage conversion portion, a first transfer gate portion configured to transfer the electric charges from the first photoelectric conversion portion to the charge-to-voltage conversion portion, and a second transfer gate portion configured to couple potentials of the charge-to-voltage conversion portion and the electric charge accumulating portion to each other. For at least a part of a period of time for which the electric charges produced by the second photoelectric conversion portion are accumulated in the electric charge accumulating portion, the drive portion causes a voltage of the variable voltage power source to be lower than that when a signal based on the electric charges accumulated in the electric charge accumulating portion is read out.

A first voltage and a second voltage lower than the first voltage can be set in the variable voltage power source, and the first voltage can be outputted through a low-pass filter.

The low-pass filter can include a resistor within a chip in which the solid-state imaging device is provided, and a capacitor mounted to the outside of the chip.

A first voltage and a second voltage lower than the first voltage can be set in the variable voltage power source, and the first voltage can be outputted through a sample-and-hold circuit.

The sample-and-hold circuit can include a switch within a chip in which the solid-state imaging device is provided, and a capacitor mounted to the outside of the chip.

The unit pixel can further include a third transfer gate portion configured to transfer the electric charges from the second photoelectric conversion portion to the electric charge accumulating portion, and an overflow path transferring the electric charges overflowing from the second photoelectric conversion portion to the electric charge accumulating portion, the overflow path being formed in a lower portion of a gate electrode of the third transfer gate portion.

The drive portion can include a signal producing portion configured to produce a gate signal for the first transfer gate portion, and a gate signal for the third transfer gate portion, and output any one of these gate signals to a common first signal line, and a switching portion configured to output the gate signal of the first transfer gate portion inputted through the first signal line to a second signal line, and output the gate signal of the third transfer gate portion inputted through the first signal line to a third signal line.

The second photoelectric conversion portion and the electric charge accumulating portion can be connected to each other without going through a transfer gate portion.

The unit pixel can further include a fourth transfer gate portion connected between the second transfer gate portion and the charge-to-voltage conversion portion.

The drive portion can include a signal producing portion configured to produce a gate signal for the second transfer gate portion and a gate signal for the fourth transfer gate portion, and output any one of these gate signals to a common fourth signal line, and a switching portion configured to output the gate signal for the second transfer gate portion inputted through the fourth signal line to a fifth signal line, and output the gate signal for the fourth transfer gate portion inputted through the fourth signal line to a sixth signal line.

With the drive portion, in a case where a first data signal based on the electric charges produced by the first photoelectric conversion portion is read out, the second transfer gate portion can be made a non-conduction state. In a case where a second data signal based on the electric charges produced by the second photoelectric conversion portion is read out, the second transfer gate portion can be made a conduction state.

The drive portion can make control in such a way that in a case where the first data signal is read out, after a first reset signal is read out in a state in which the charge-to-voltage conversion portion is reset, the first data signal is read out, and in a case where the second data signal is read out, after the second data signal is read out, a second reset signal is read out in a state in which an area in which the potentials of the charge-to-voltage conversion portion and the electric charge accumulating portion are coupled to each other is reset.

A signal processing portion can be further provided which to produce a first difference signal as a difference between the first data signal and the first reset signal, and a second difference signal as a difference between the second data signal and the second reset signal, use the first difference signal as a pixel signal of the unit pixel in a case where a value of the first difference signal is equal to or smaller than a predetermined threshold value, and use the second difference signal as the pixel signal of the unit pixel in a case where the value of the first difference signal exceeds the threshold value.

A signal processing portion can be further provided which to produce a first difference signal as a difference between the first data signal and the first reset signal, and a second difference signal as a difference between the second data signal and the second reset signal, and synthesize the first difference signal and the second difference signal in a synthesis ratio set on a basis of a value of the first difference signal, thereby producing a pixel signal of the unit pixel.

A counter electrode of the electric charge accumulating portion is connected to a variable voltage power source. In this case, the drive portion can more reduce a voltage applied to the counter electrode of the electric charge accumulating portion for a period of time for which the electric charges are accumulated in the electric charge accumulating portion than for a period of time for which a signal based on the electric charges accumulated in the electric charge accumulating portion is read out.

In a method of driving a solid-state imaging device of a second aspect of the present technique, the solid-state imaging device includes a pixel array portion in which a plurality of unit pixels are arranged. The unit pixel includes a first photoelectric conversion portion, a second photoelectric conversion portion a sensitivity of which is lower than that of the first photoelectric conversion portion, an electric charge accumulating portion configured to accumulate electric charges produced by the second photoelectric conversion portion, a counter electrode of the electric charge accumulating portion being connected to a variable voltage power source, a charge-to-voltage conversion portion, a first transfer gate portion configured to transfer the electric charges from the first photoelectric conversion portion to the charge-to-voltage conversion portion, and a second transfer gate portion configured to couple potentials of the charge-to-voltage conversion portion and the electric charge accumulating portion to each other. The method includes, by the solid-state imaging device, for at least a part of a period of time for which the electric charges produced by the second photoelectric conversion portion are accumulated in the electric charge accumulating portion, causing a voltage of the variable voltage power source to be lower than that when a signal based on the electric charges accumulated in the electric charge accumulating portion is read out.

An electronic apparatus of a third aspect of the present technique includes a solid-state imaging device including a pixel array portion in which a plurality of unit pixels are arranged, and a drive portion configured to control an operation of the unit pixel. The unit pixel includes a first photoelectric conversion portion, a second photoelectric conversion portion a sensitivity of which is lower than that of the first photoelectric conversion portion, an electric charge accumulating portion configured to accumulate electric charges produced by the second photoelectric conversion portion, a counter electrode of the electric charge accumulating portion being connected to a variable voltage power source, a charge-to-voltage conversion portion, a first transfer gate portion configured to transfer the electric charges from the first photoelectric conversion portion to the charge-to-voltage conversion portion, and a second transfer gate portion configured to couple potentials of the charge-to-voltage conversion portion and the electric charge accumulating portion to each other. For at least a part of a period of time for which the electric charges produced by the second photoelectric conversion portion are accumulated in the electric charge accumulating portion, the drive portion causes a voltage of the variable voltage power source to be lower than that when a signal based on the electric charges accumulated in the electric charge accumulating portion is read out. The electronic apparatus further includes a signal processing portion configured to process a signal from the solid-state imaging device.

In the first aspect or the third aspect of the present technique, the electric charges are transferred from the first photoelectric conversion portion to the charge-to-voltage conversion portion. The electric charges produced by the second photoelectric conversion portion are accumulated in the electric charge accumulating portion. The potentials of the charge-to-voltage conversion portion and the electric charge accumulating portion are coupled to each other.

In the second aspect of the present technique, the electric charges produced by the second photoelectric conversion portion are accumulated in the electric charge accumulating portion. In a case where the first data signal based on the electric charges produced by the first photoelectric conversion portion is read out, the second transfer gate portion is made the non-conduction state. The electric charges accumulated in the first photoelectric conversion portion are transferred to the charge-to-voltage conversion portion. In a case where the second data signal based on the electric charges produced by the second photoelectric conversion portion is read out, the second transfer gate portion is made the conduction state. Thus, the potentials of the charge-to-voltage conversion portion and the electric charge accumulating portion are coupled to each other.

Advantageous Effect of Invention

According to the first aspect to the third aspect of the present technique, the dynamic range of the solid-state imaging device can be expanded without deteriorating the image quality.

DESCRIPTION OF EMBODIMENTS

Hereinafter, modes for carrying out the invention (hereinafter described as "embodiments") will be described in detail with reference to the drawings. It should be noted that the description will now be given in accordance with the following order.

1. Solid-State Imaging Device to Which Present Technique Is Applied
2. First Embodiment
3. Second Embodiment (example 1 in which voltage applied to counter electrode of electric charge accumulating portion is made variable)
4. Third Embodiment (example in which third transfer gate portion is deleted)
5. Fourth Embodiment (example in which conversion efficiency at time of reading high-sensitivity data signal is made variable)
6. Fifth Embodiment (example in which conversion efficiency at time of reading high-sensitivity data signal is made variable, and third transfer gate portion is deleted)
7. Sixth Embodiment (example 2 in which voltage applied to counter electrode of electric charge accumulating portion is made variable)
8. Explanation regarding Noise Removing Processing and Arithmetic Operation Processing
9. Modified Changes
10. Examples of Use of Solid-State Imaging Device 1. Solid-State Imaging Device to which Present Technique is Applied {1-1. Basic System Configuration}

Figure 1:
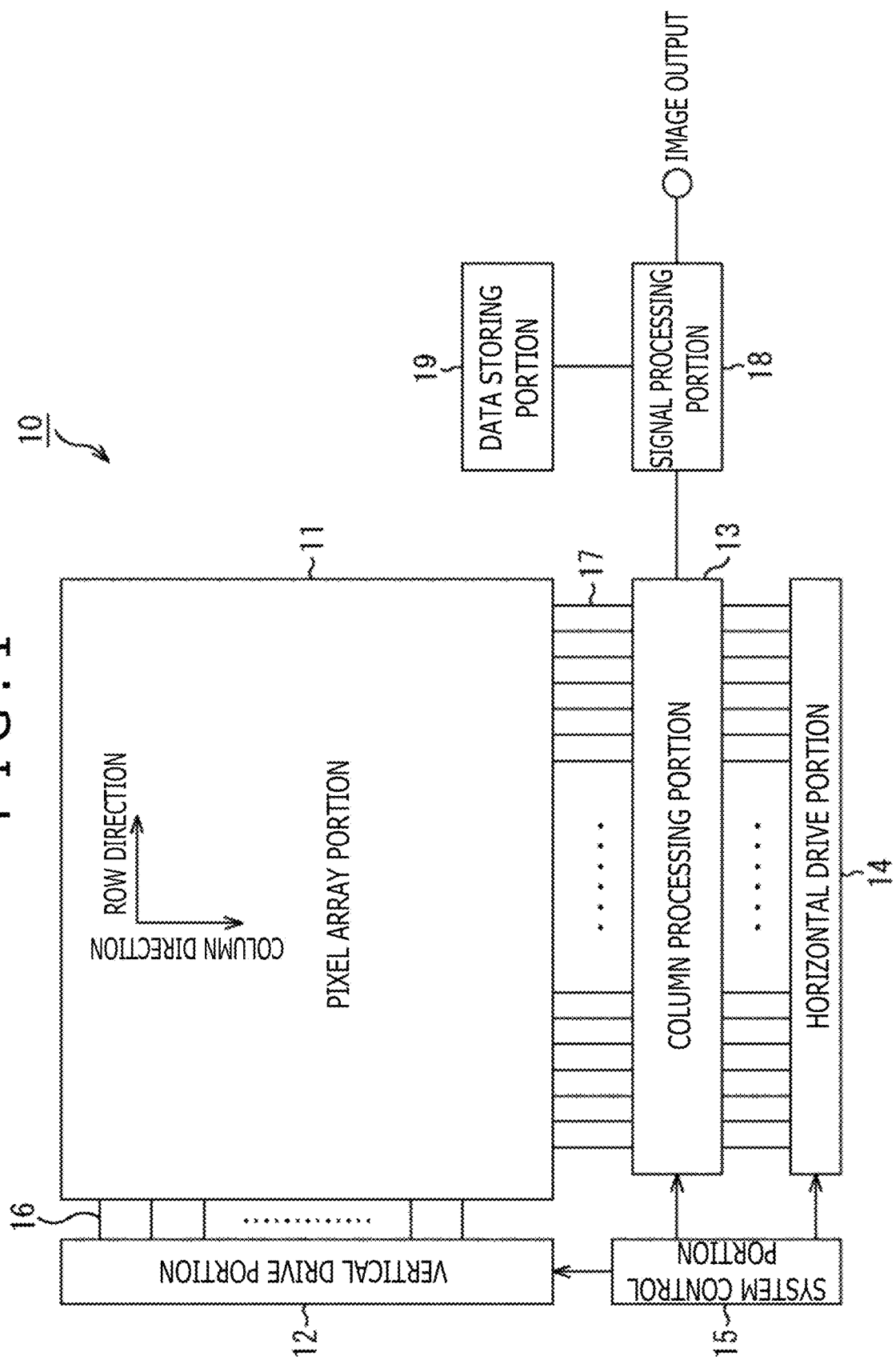
FIG. 1 is a system configuration diagram depicting an outline of a configuration of a CMOS image sensor to which the present technique is applied.

FIG. 1 is a system configuration diagram depicting an outline of a configuration of a solid-state imaging device to which the present technique is applied, for example, a CMOS image sensor as a sort of X-Y address system solid-state imaging device. Here, the CMOS image sensor means an image sensor which is manufactured by applying a CMOS process, or by partially using the CMOS process.

A CMOS image sensor 10 pertaining to the present application example has a pixel array portion 11 formed on a semiconductor substrate (chip) (not depicted), and a peripheral circuit portion integrated on the same semiconductor substrate as that of the pixel array portion 11 concerned. The peripheral circuit portion, for example, includes a vertical drive portion 12, a column processing portion 13, a horizontal drive portion 14, and a system control portion 15.

The CMOS image sensor 10 is further provided with a signal processing portion 18 and a data storing portion 19. The signal processing portion 18 and the data storing portion 19 may be both mounted on the same substrate as that of the CMOS image sensor 10, or may be both arranged on a substrate different from that of the CMOS image sensor 10. In addition, pieces of processing executed by the signal processing portion 18 and the data storing portion 19 may be pieces of processing executed by an external signal processing portion provided on a substrate different from that of the CMOS image sensor 10, for example, a DSP (Digital Signal Processor) circuit, or software.

The pixel array portion 11 has a configuration in which unit pixels (hereinafter simply described as "pixels" in some cases) each having a photoelectric conversion portion producing the electric charges responding to a quantity of received light and accumulating therein the electric charges are arranged in a row direction and in a column direction, that is, two-dimensionally arranged in a matrix. Here, the row direction means an array direction (that is, a horizontal direction) of the pixels in the pixel rows, and the column direction means an array direction (that is, a vertical direction) of the pixels in the pixel columns. The details of a concrete circuit configuration and a pixel structure of the unit pixel will be described later.

In the pixel array portion 11, for the matrix-shaped pixel array, a pixel drive line 16 is wired along the row direction every pixel row, and a vertical signal line 17 is wired along the column direction every pixel column. The pixel drive line 16 transmits a drive signal in accordance with which the drive is carried out when a signal is read out from the pixel. Although in FIG. 1, one wiring is illustrated as the pixel drive line 16, the number of pixel drive lines 16 is by no means limited to one. Each end of the pixel drive lines 16 are connected to respective output ends corresponding to the rows of the vertical drive portion 12.

The vertical drive portion 12 includes a shift register, an address decoder, and the like, and drives the pixels of the pixel array portion 11 simultaneously in all the pixels, in units of rows, or the like. That is, the vertical drive portion 12 configures, together with the system control portion 15 controlling the vertical drive portion 12 concerned, a drive portion controlling the operations of the pixels of the pixel array portion 11. Although a concrete configuration of the vertical drive portion 12 is omitted in illustration thereof, in general, the vertical drive portion 12 has two scanning systems: a read scanning system; and a sweep scanning system.

The read scanning system, for reading out the signal from the unit pixel, selectively scans in order the unit pixels of the pixel array portion 11 in units of rows. The signal read out from the unit pixel is an analog signal. The sweep scanning system carries out the sweep scanning for the read row for which the read scanning is carried out by the read scanning system prior to the read scanning by an exposure time.

The sweep scanning by the sweep scanning system results in that the unnecessary electric charges are swept out from the photoelectric conversion portion of the unit pixel of the read row, thereby resetting the photoelectric conversion portion concerned. Then, the unnecessary electric charges are swept (reset) by the sweep scanning system, thereby carrying out a so-called electronic shutter operation. Here, the electronic shutter operation means an operation for abandoning the electric charges accumulated in the photoelectric conversion portion to newly start the exposure (start the accumulation of the electric charges).

The signal read out by the reading operation by the read scanning system corresponds to the light quantity of received light by the last operation or in and after the electronic shutter operation. Then, a period of time ranging from either a reading timing by the last reading operation or a sweep timing by the electronic shutter operation to a reading timing by the current reading operation becomes a period of time for exposure for the electric charges in the unit pixel.

The signals outputted from the unit pixels of the pixel row which is selectively scanned by the vertical drive portion 12 are inputted to the column processing portion 13 through the respective vertical signal lines 17 every pixel column. The column processing portion 13 executes predetermined signal processing for the signals outputted through the respective vertical signal lines 17 from the pixels of the selected row every pixel column of the pixel array portion 11, and temporarily holds therein the pixel signals after the signal processing.

Specifically, the column processing portion 13 executes, as the signal processing, at least noise removing processing, for example, CDS (Correlated Double Sampling) processing or DDS (Double Data Sampling) processing. For example, by executing the CDS processing, reset noise and a fixed pattern noise peculiar to the pixel such as threshold value dispersion of an amplification transistor within the pixel are removed away. The column processing portion 13 can be given, for example, an AD (analog-digital) conversion function in addition to the noise removing processing, and can convert the analog pixel signal into a digital signal, thereby outputting the resulting digital signal.

The horizontal drive portion 14 includes a shift register, an address decoder, and the like, and selects the unit circuits, in order, corresponding to the pixel column of the column processing portion 13. The selective scanning by the horizontal drive portion 14 results in that the pixel signals subjected to the signal processing every unit circuit in the column processing portion 13 are outputted in order.

The system control portion 15 includes a timing generator for producing various kinds of timing signals, and the like. The system control portion 15 carries out the drive control for the vertical drive portion 12, the column processing portion 13, the horizontal drive portion 14, and the like on the basis of the various kinds of timings produced by the timing generator concerned.

The signal processing portion 18 has at least an arithmetic operation processing function, and executes various pieces of signal processing such as arithmetic operation processing and the like for the pixel signals outputted from the column processing portion 13. The data storing portion 19, in executing the signal processing in the signal processing portion 18, temporarily stores therein the data necessary for that processing.

{1-2. Other System Configurations}

The CMOS image sensor 10 to which the present technique is applied is by no means limited to one having the system configuration described above. Other system configurations can include the following system configurations.

Figure 2:
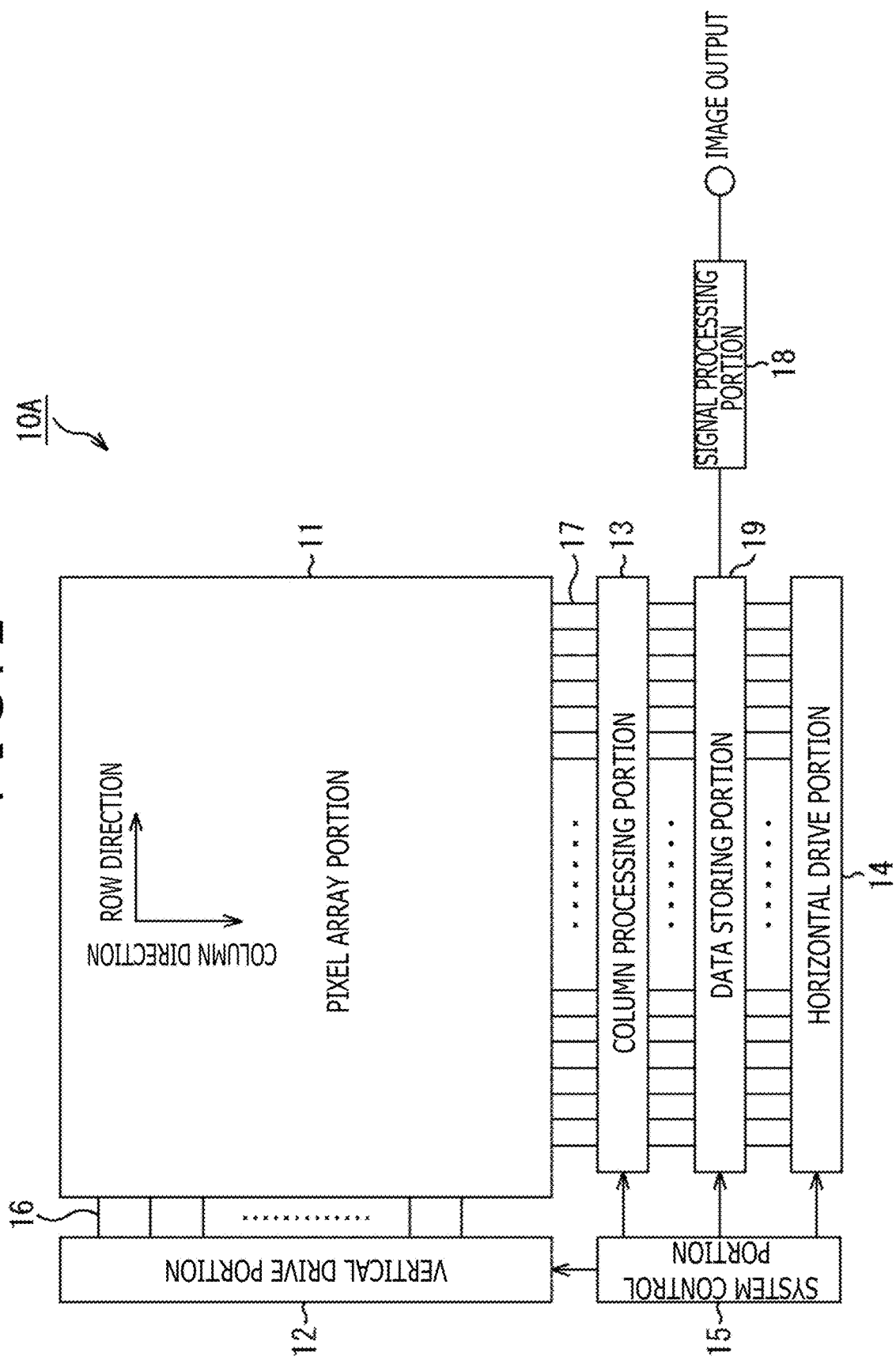
FIG. 2 is a system configuration diagram (part 1) depicting another system configuration of a CMOS image sensor to which the present technique is applied.

For example, a CMOS image sensor 10A having a system configuration in which as depicted in FIG. 2, a data storing portion 19 is arranged in a subsequent stage of the column processing portion 13, and the pixel signals outputted from the column processing portion 13 are supplied to the signal processing portion 18 via the data storing portion 19, for example, can be given.

Figure 3:
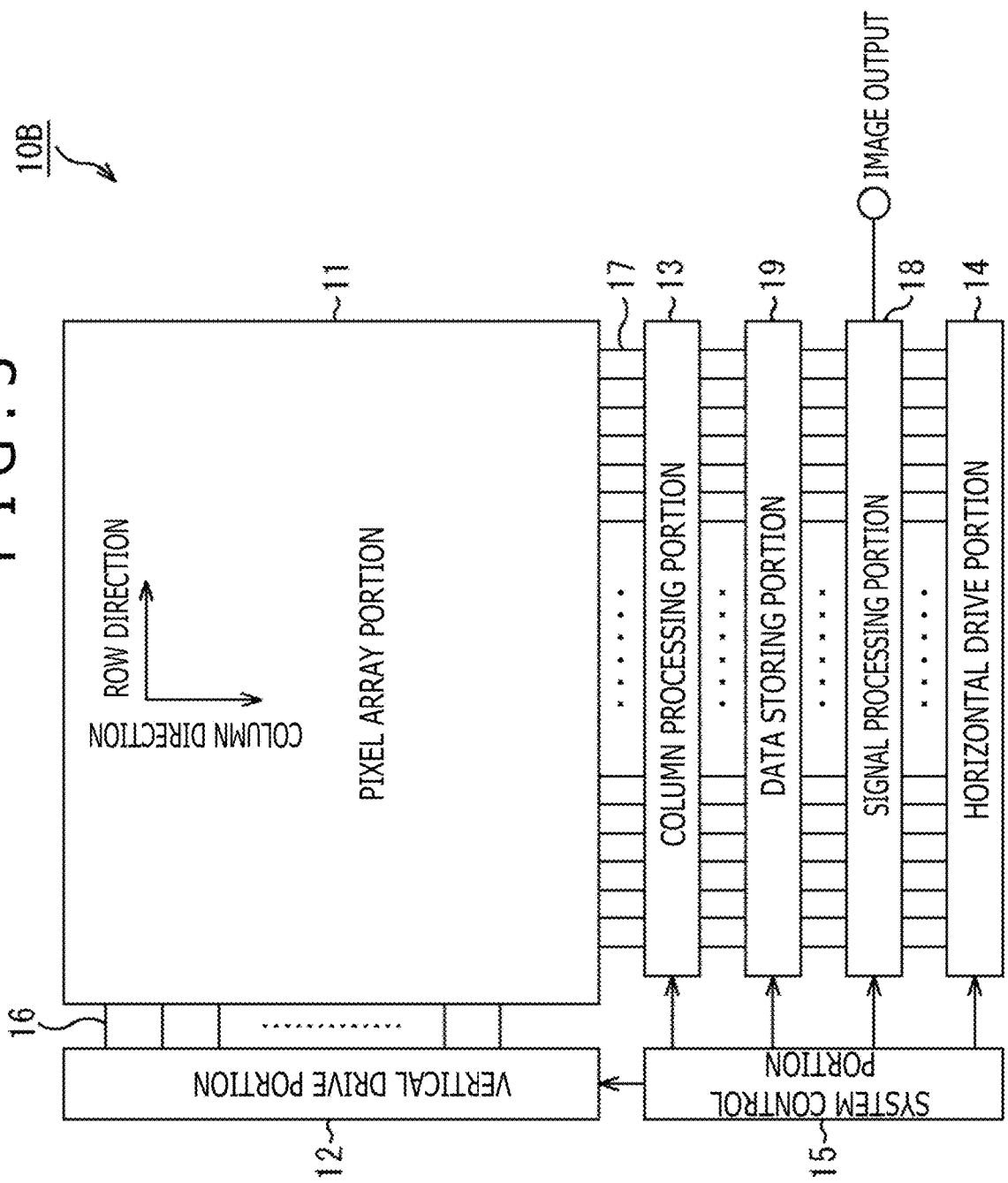
FIG. 3 is a system configuration diagram (part 2) depicting still another system configuration of a CMOS image sensor to which the present technique is applied.

Moreover, a CMOS image sensor 10B having a system configuration in which as depicted in FIG. 3, a column processing portion 13 is given an AD conversion function of carrying out AD conversion every column of the pixel array portion 11 or every plurality of columns, and the data storing portion 19 and the signal processing portion 18 are provided in parallel to the column processing portion 13 can also be given.

2. First Embodiment

Next, a first embodiment of the present technique will be described with reference to FIG. 4 to FIG. 7.

{Circuit Configuration of Unit Pixel 100A}

Figure 4:
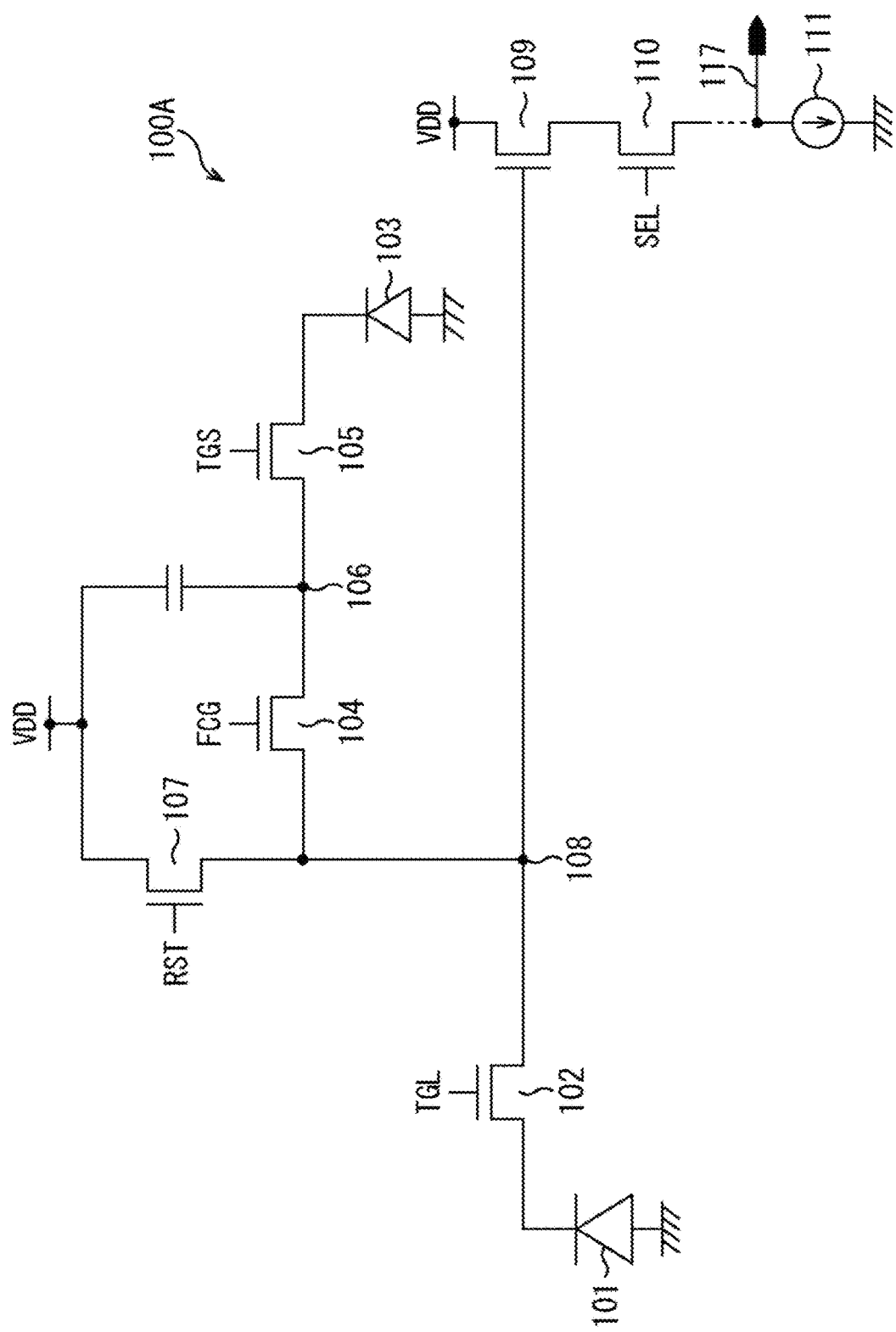
FIG. 4 is a circuit diagram depicting an example of a configuration of a unit pixel in a first embodiment of the present technique.

FIG. 4 is a circuit diagram depicting an example of a configuration of a unit pixel 100A which is arranged in the pixel array portion 11 of FIG. 1 to FIG. 3.

The unit pixel 100A includes a first photoelectric conversion portion 101, a first transfer gate portion 102, a second photoelectric conversion portion 103, a second transfer gate portion 104, a third transfer gate portion 105, an electric charge accumulating portion 106, a reset gate portion 107, a FD (floating diffusion) portion 108, an amplification transistor 109, and a selection transistor 110.

In addition, for the unit pixel 100A, a plurality of drive lines is wired as the pixel drive lines 16 of FIG. 1 to FIG. 3, for example, every pixel row. Then, various kinds of drive signals TGL, TGS, FCG, RST, and SEL are supplied from the vertical drive portion 12 of FIG. 1 to FIG. 3 through a plurality of drive lines. Each of these drive signals is a pulse signal in which a state of a High level (for example, a power source voltage VDD) is an active state, and a state of a Low level (for example, a negative electric potential) is a non-active state because each of the transistors of the unit pixel 100A is an NMOS transistor.

The first photoelectric conversion portion 101, for example, includes a photodiode having PN junction. The first photoelectric conversion portion 101 produces the electric charges responding to a quantity of received light, and accumulates therein the electric charges thus produced.

The first transfer gate portion 102 is connected between the first photoelectric conversion portion 101 and the FD portion 108. The drive signal TGL is applied to a gate electrode of the first transfer gate portion 102. When the drive signal TGL becomes the active state, the first transfer gate portion 102 becomes the conduction state. As a result, the electric charges accumulated in the first photoelectric conversion portion 101 are transferred to the FD portion 108 through the first transfer gate portion 102.

The second photoelectric conversion portion 103, for example, includes a photodiode having the PN junction similarly to the case of the first photoelectric conversion portion 101. The second photoelectric conversion portion 103 produces the electric charges responding to a quantity of received light, and accumulates therein the electric charges thus produced.

When the first photoelectric conversion portion 101 and the second photoelectric conversion portion 103 are compared with each other, the first photoelectric conversion portion 101 is wider in area of a light receiving surface, and higher in sensitivity, and the second photoelectric conversion portion 103 is narrower in area of a light receiving surface, and lower in sensitivity.

The second transfer gate portion 104 is connected between the electric charge accumulating portion 106 and the FD portion 108. The drive signal FCG is applied to a gate electrode of the second transfer gate portion 104. When the drive signal FCG becomes the active state, the second transfer gate portion 104 becomes the conduction state. As a result, the potentials of the electric charge accumulating portion 106 and the FD portion 108 are coupled to each other.

The third transfer gate portion 105 is connected between the second photoelectric conversion portion 103 and the electric charge accumulating portion 106. The drive signal TGS is applied to a gate electrode of the third transfer gate portion 105. When the drive signal TGS becomes the active state, the third transfer gate portion 105 becomes the conduction state. As a result, the electric charges accumulated in the second photoelectric conversion portion 103 are transferred to the electric charge accumulating portion 106 or the area in which the potentials of the electric charge accumulating portion 106 and the FD portion 108 are coupled to each other through the third transfer gate portion 105.

In addition, in a lower portion of the gate electrode of the third transfer gate portion 105, the potential is slightly deep. Thus, there is formed an overflow path for transferring the electric charges an amount of which exceeds an amount of saturated electric charges of the second photoelectric conversion portion 103 to overflow from the second photoelectric conversion portion 103 to the electric charge accumulating portion 106. It should be noted that hereinafter, the overflow path formed in the lower portion of the gate electrode of the third transfer gate portion 105 is simply referred to as the overflow path of the third transfer gate portion 105.

The electric charge accumulating portion 106, for example, includes a capacitor and is connected between the second transfer gate portion 104 and the third transfer gate portion 105. A counter electrode of the electric charge accumulating portion 106 is connected to a power source VDD for supplying the power source voltage VDD. The electric charge accumulating portion 106 accumulates therein the electric charges transferred from the second photoelectric conversion portion 103.

The reset gate portion 107 is connected between the power source VDD and the FD portion 108. The drive signal RST is applied to a gate electrode of the reset gate portion 107. When the drive signal RST becomes the active state, the reset gate portion 107 becomes the conduction state, and the electric potential of the FD portion 108 is reset to the level of the power source voltage VDD.

The FD portion 108 subjects the electric charges to the charge-to-voltage conversion to obtain a voltage signal, and outputs the resulting voltage signal.

The amplification transistor 109 is connected in gate electrode thereof to the FD portion 108, and is connected in drain electrode thereof to the power source VDD. Thus, the amplification transistor 109 becomes an input portion of a reading circuit for reading out the electric charges held in the FD portion 108, a so-called source follower circuit. That is, the amplification transistor 109 is connected in source electrode thereof to the vertical signal line 17 through the selection transistor 110, thereby configuring the source follower circuit together with a constant current source 111 connected to one end of the vertical signal line 17 concerned.

The selection transistor 110 is connected between the source electrode of the amplification transistor 109, and the vertical signal line 17. The drive signal SEL is applied to a gate electrode of the selection transistor 110. When the drive signal SEL becomes the active state, the selection transistor 110 becomes the conduction state, and the unit pixel 100A becomes a selection state. As a result, the pixel signal outputted from the amplification transistor 109 is outputted to the vertical signal line 17 through the selection transistor 110.

It should be noted that hereinafter, it is also said as the drive signals being turned ON that the drive signals become the active state, and it is also said as the drive signals being turned OFF that the drive signals become the non-active state. In addition, hereinafter, it is also said as the gate portions or the transistors being turned ON that the gate portions or the transistors become the conduction state, and it is also said as the gate portions or the transistors being turned OFF that the gate portions or the transistors become the non-conduction state.

{Operation of Unit Pixel 100A}

Next, an operation of the unit pixel 100A will be described with reference to timing charts of FIG. 5 and FIG. 6.

(Operation at Time of Start of Exposure of Unit Pixel 100A)

Firstly, an operation at the time of start of exposure of the unit pixel 100A will be described with reference to the timing chart of FIG. 5. This processing, for example, is executed in a predetermined scanning order every pixel row of the pixel array portion 11, or every plurality of pixel rows. It should be noted that FIG. 5 depicts the timing chart of a horizontal synchronizing signal XHS, and the drive signals SEL, RST, TGS, FCG, and TGL.

Firstly, at time t1, the horizontal synchronizing signal XHS is inputted, and the processing for exposing the unit pixel 100A is started.

Next, at time t2, the drive signal FCG is turned ON, and the second transfer gate portion 104 is turned ON. As a result, the potentials of the electric charge accumulating portion 106 and the FD portion 108 are coupled to each other.

Next, at time t3, the drive signals RST and TGS are each turned ON, and the reset gate portion 107 and the third transfer gate portion 105 are each turned ON. As a result, the electric charges accumulated in the second photoelectric conversion portion 103 are transferred to the area in which the potentials of the electric charge accumulating portion 106 and the FD portion 108 are coupled to each other through the third transfer gate portion 105. Then, the area in which the coupling is carried out is reset.

Next, at time t4, the drive signals RST and TGS are each turned OFF, and the reset gate portion 107 and the third transfer gate portion 105 are each turned OFF. As a result, the accumulation of the electric charges in the second photoelectric conversion portion 103 is started, and a period of time for the exposure is started.

Next, at time t5, the drive signal FCG is turned OFF and the second transfer gate portion 104 is turned OFF. As a result, the electric charge accumulating portion 106 starts to accumulate the electric charges which overflow from the second photoelectric conversion portion 103 to be transferred through the overflow path of the third transfer gate portion 105.

Next, at time t6, the drive signals RST and TGL are each turned ON, and the reset gate portion 107 and the first transfer gate portion 102 are each turned ON. As a result, the electric charges accumulated in the first photoelectric conversion portion 101 are transferred to the FD portion 108 through the first transfer portion 102. Then, the FD portion 108 is reset.

Next, at time t7, the drive signals RST and TGL are each turned OFF, and the reset gate portion 107 and the first transfer gate portion 102 are each turned OFF. As a result, the accumulation of the electric charges in the first photoelectric conversion portion 101 is started.

Then, at time t8, the horizontal synchronizing signal XHS is inputted.

(Operation at Time of Reading from Unit Pixel 100A)

Next, an operation at the time of reading out the pixel signal from the unit pixel 100A will be described with reference to the timing chart of FIG. 6. This processing, for example, is executed in a predetermined scanning order after a lapse of predetermined time after the processing of FIG. 5 is executed every pixel row, or every plurality of pixel rows in the pixel array portion 11. It should be noted that FIG. 6 depicts the timing chart of the horizontal synchronizing signal XHS, and the drive signals SEL, RST, TGS, FCG, and TGL.

Firstly, at time t21, the horizontal synchronizing signal XHS is inputted, and a period of time for the reading from the unit pixel 100A is started.

Next, at time t22, the drive signal RST is turned ON, and the reset gate portion 107 is turned ON. As a result, the electric potential of the FD portion 108 is reset to the level of the power source voltage VDD.

Next, at time t23, the drive signal RST is turned OFF, and the reset gate portion 107 is turned OFF.

Next, at time t24, the drive signals SEL and FCG are each turned ON, and the selection transistor 110 and the second transfer gate portion 104 are each turned ON. As a result, the unit pixel 100A becomes the selection state, and the potentials of the electric charge accumulating portion 106 and the FD portion 108 are coupled to each other.

Next, at time t25, the drive signal TGS is turned ON, and the third transfer gate portion 105 is turned ON. As a result, the electric charges accumulated in the second photoelectric conversion portion 103 are transferred to the area in which the potentials of the electric charge accumulating portion 106 and the FD portion 108 are coupled to each other. Then, the electric charges accumulated in each of the second photoelectric conversion portion 103 and the electric charge accumulating portion 106 during the period of time for the exposure are accumulated in the area in which the potentials are coupled to each other.

At the time t25, the reading of the pixel signal is started, and the period of time for the exposure is ended.

Next, at time t26, the drive signal TGS is turned OFF, and the third transfer gate portion 105 is turned OFF. As a result, the transfer of the electric charges from the second photoelectric conversion portion 103 is stopped.

Next, at time to between the time t26 and time t27, a signal SL based on an electric potential of the area in which the potentials of the electric charge accumulating portion 106 and the FD portion 108 are coupled to each other is outputted to the vertical signal line 17 through the amplification transistor 109 and the selection transistor 110. The signal SL is a signal which is produced in the second photoelectric conversion portion 103 during a period of time for the exposure, and is based on the electric charges accumulated in each the second photoelectric conversion portion 103 and the electric charge accumulating portion 106. In addition, the signal SL becomes a signal based on the electric potential of the coupling area in the state in which the electric charges accumulated in each the second photoelectric conversion portion 103 and the electric charge accumulating portion 106 during the period of time for the exposure are accumulated in the area in which the potentials of the electric charge accumulating portion 106 and the FD portion 108 are coupled to each other. Therefore, the capacitance with which at the time of reading out the signal SL, the electric charges are subjected to the charge-to-voltage conversion becomes a capacitance obtained in combination of the electric charge accumulating portion 106 and the FD portion 108.

It should be noted that hereinafter, the signal SL is referred to as a low-sensitivity data signal SL as well.

Next, at the time t27, the drive signal RST is turned ON, and the reset gate portion 107 is turned ON. As a result, the area in which the potentials of the electric charge accumulating portion 106 and the FD portion 108 are coupled to each other is reset.

Next, at time t28, the drive signal FCG is turned OFF, and the second transfer gate portion 104 is turned OFF.

Next, at time t29, the drive signal RST is turned OFF, and the reset gate portion 107 is turned OFF.

Next, at time t30, the drive signal FCG is turned ON, and the second transfer gate portion 104 is turned ON. As a result, the potentials of the electric charge accumulating portion 106 and the FD portion 108 are coupled to each other.

Next, at time tb between the time t30 and time t31, a signal NL based on the electric potential of the area in which the potentials of the electric charge accumulating portion 106 and the FD portion 108 are coupled to each other is outputted to the vertical signal line 17 through the amplification transistor 109 and the selection transistor 110. This signal NL becomes a signal based on the electric potential of the coupling area in the state in which the area in which the potentials of the electric charge accumulating portion 106 and the FD portion 108 are coupled to each other is reset.

It should be noted that hereinafter, the signal NL is referred to as a low-sensitivity reset signal NL as well.

Next, at the time t31, the drive signal FCG is turned OFF, and the second transfer gate portion 104 is turned OFF.

Next, at time t32, the drive signal RST is turned ON, and the reset gate portion 107 is turned ON. As a result, the electric potential of the FD portion 108 is reset to the level of the power source voltage VDD.

Next, at time t33, the drive signal RST is turned OFF, and the reset gate portion 107 is turned OFF.

Next, at time tc between the time t33 and time t34, a signal NH based on the electric potential of the FD portion 108 is outputted to the vertical signal line 17 through the amplification transistor 109 and the selection transistor 110. The signal NH becomes a signal based on the electric potential of the FD portion 108 in the reset state.

It should be noted that hereinafter, the signal NH is referred to as a high-sensitivity reset signal NH as well.

Next, at the time t34, the drive signal TGL is turned ON, and the first transfer gate portion 102 is turned ON. As a result, the electric charges produced and accumulated in the first photoelectric conversion portion 101 during the period of time for the exposure are transferred to the FD portion 108 through the first transfer gate portion 102.

Next, at time t35, the drive signal TGL is turned OFF, and the first transfer gate portion 102 is turned OFF. As a result, the transfer of the electric charges from the first photoelectric conversion portion 101 to the FD portion 108 is stopped.

Next, at time td between the time t35 and time t36, a signal SH based on the electric potential of the FD portion 108 is outputted to the vertical signal line 17 through the amplification transistor 109 and the selection transistor 110. The signal SH is a signal based on the electric charges which are produced and accumulated for the period of time for the exposure in the first photoelectric conversion portion 101. In addition, the signal SH becomes a signal based on the electric potential of the FD portion 108 in the state in which the electric charges accumulated in the first photoelectric conversion portion 101 for the period of time for the exposure are accumulated in the FD portion 108. Therefore, the capacitance with which the electric charges at the time of reading out the signal SH are subjected to the charge-to-voltage conversion becomes the capacitance of the FD portion 108, and thus becomes smaller than that at the time of reading out the low-sensitivity data signal SL at the time ta.

It should be noted that hereinafter, the signal SH is referred to as a high-sensitivity data signal SH as well.

Next, at the time t36, the drive signal SEL is turned OFF, and the selection transistor 110 is turned OFF. As a result, the unit pixel 100A becomes the non-selection state.

Next, at time t37, the horizontal synchronizing signal XHS is inputted, and the period of time for reading out the pixel signal from the unit pixel 100A is ended.

{Circuit Configuration of Unit Pixel 100B}

Figure 7:
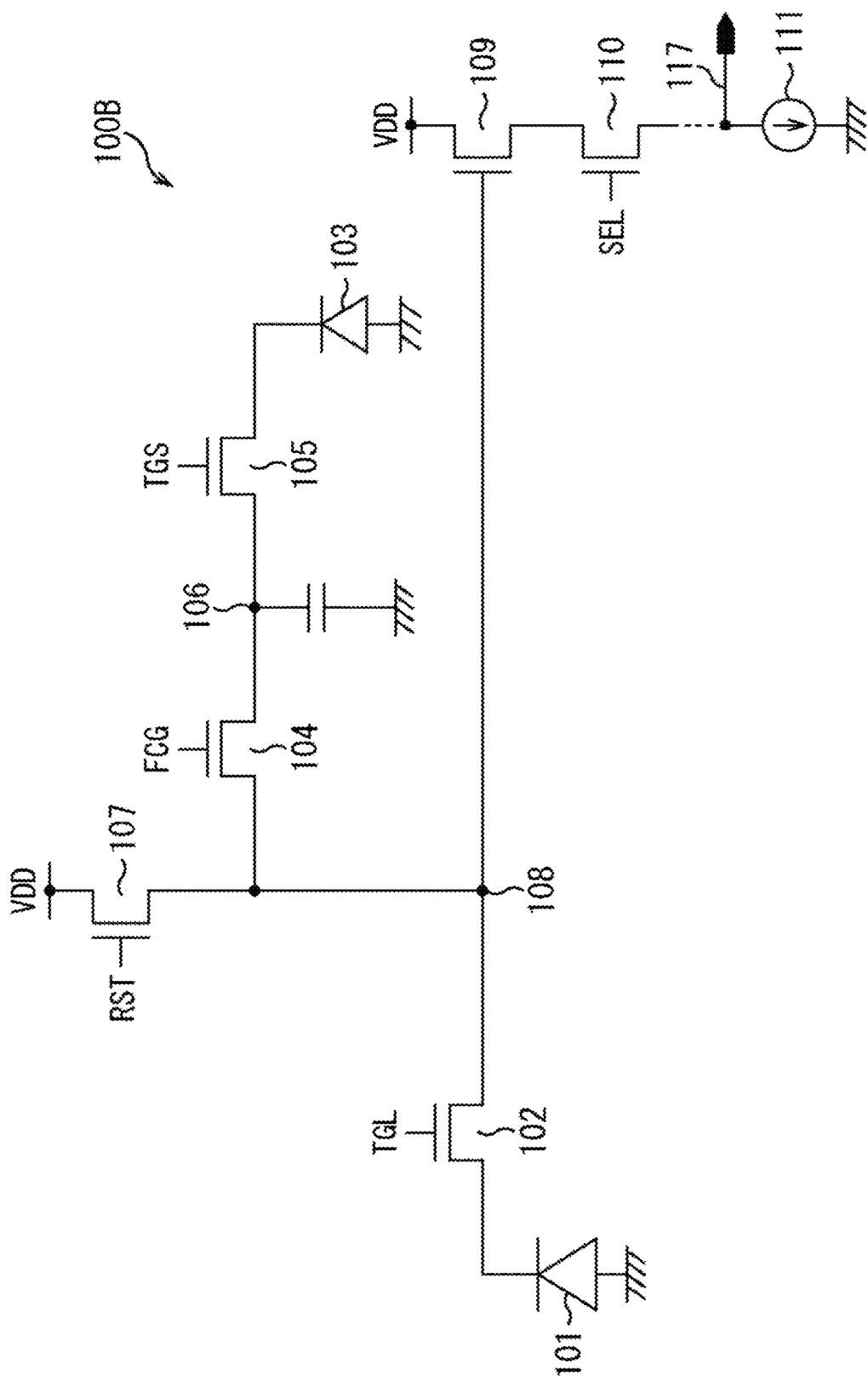
FIG. 7 is a circuit diagram depicting a modified change of the unit pixel in the first embodiment of the present technique.

FIG. 7 is a circuit diagram depicting an example of a configuration of a unit pixel 100B as a modified change of the unit pixel 100A of FIG. 4. It should be noted that in the figure, portions corresponding to those of FIG. 4 are assigned the same reference symbols, and a description thereof is suitably omitted here.

When the unit pixel 100B is compared with the unit pixel 100A of FIG. 4, a connection position of the counter electrode of the electric charge accumulating portion 106 is different from that in the case of the unit pixel 100A of FIG. 4. That is, in the unit pixel 100B, the counter electrode of the electric charge accumulating portion 106 is connected to the ground.

Figure 5:
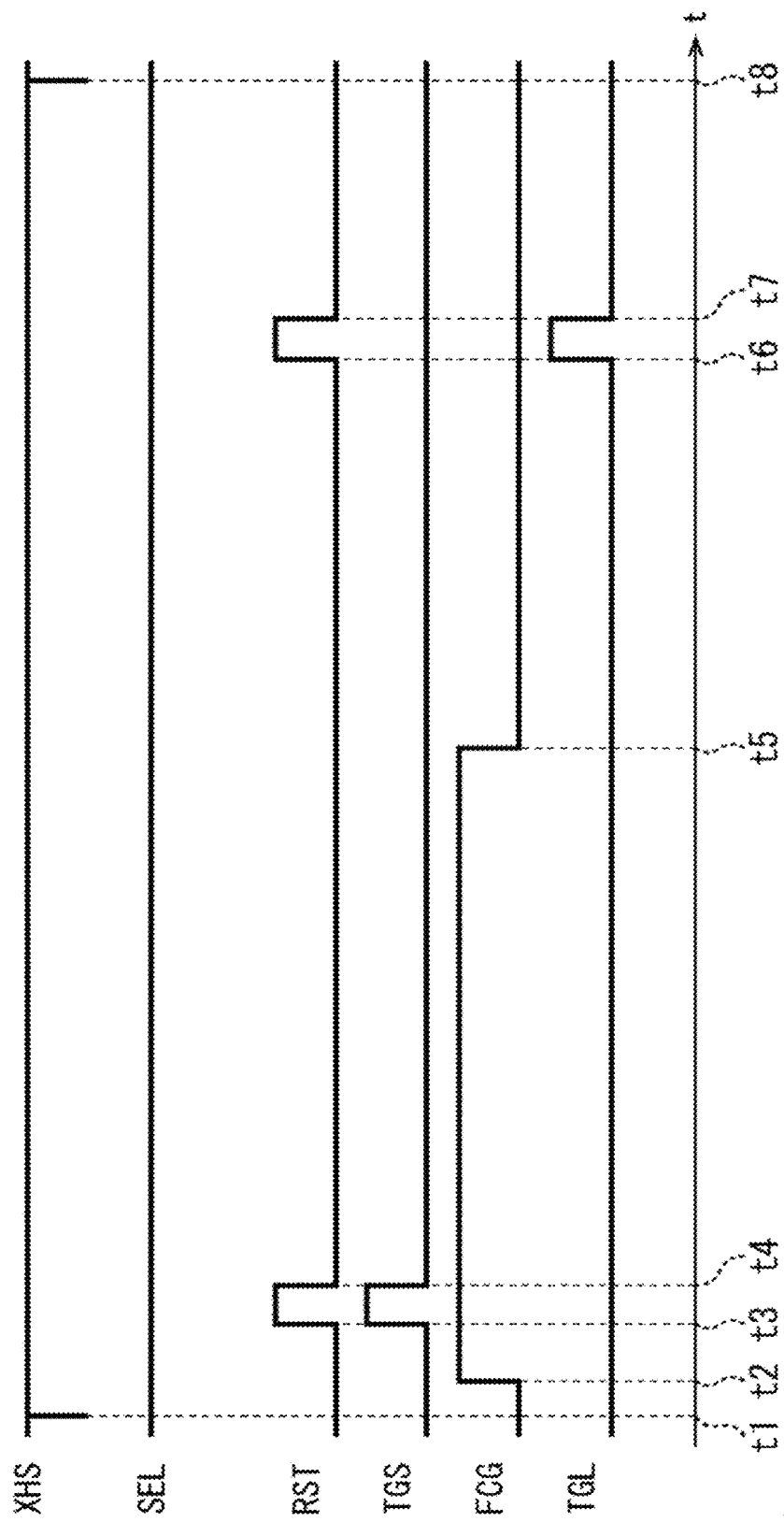
FIG. 5 is a timing chart explaining an operation at the time of start of exposure of the unit pixel of FIG. 4.
Figure 6:
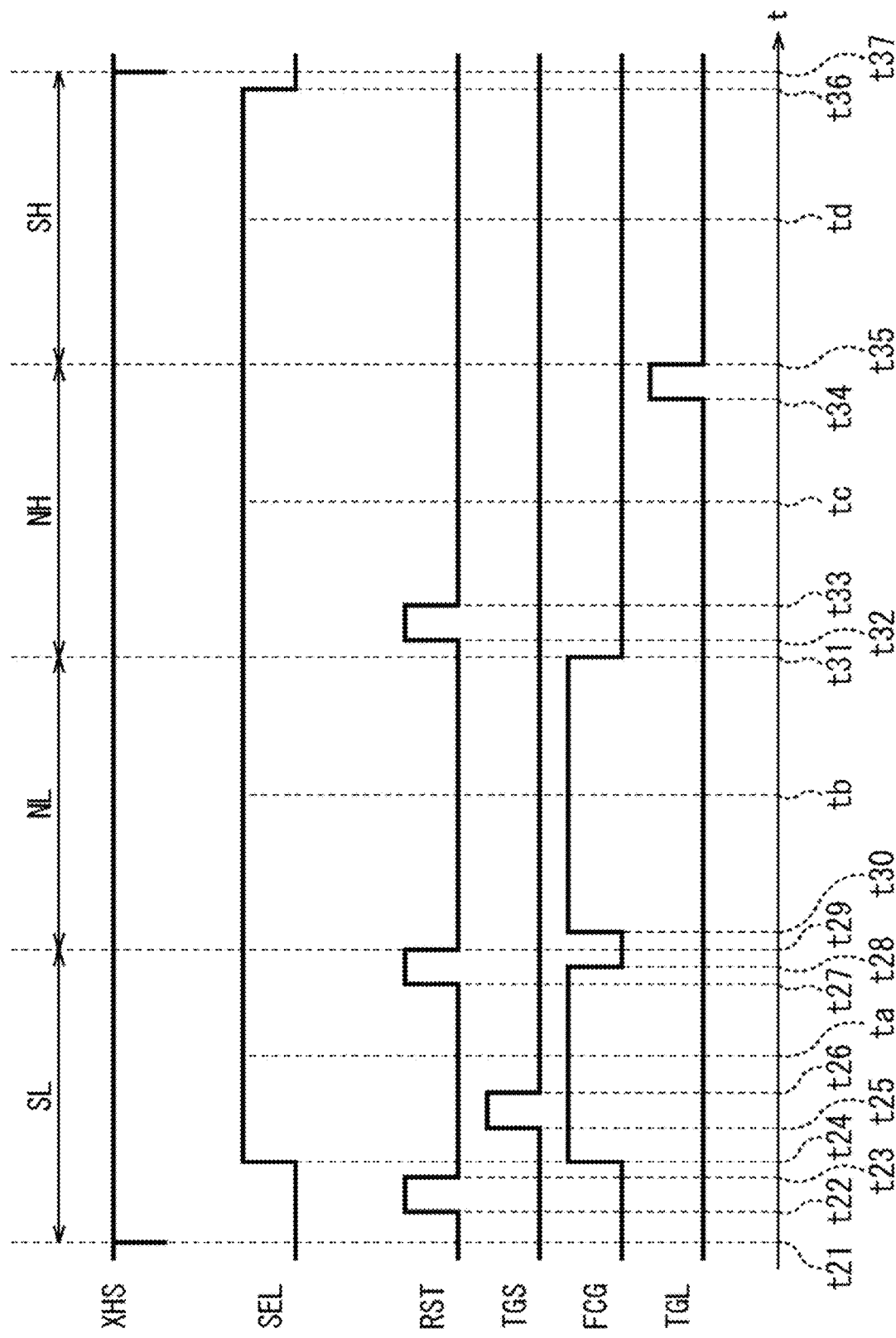
FIG. 6 is a timing chart explaining an operation at the time of start of reading from the unit pixel of FIG. 4.

It should be noted that the unit pixel 100B, similarly to the case of the unit pixel 100A, is operated in accordance with the timing charts depicted in FIG. 5 and FIG. 6.

3. Second Embodiment

Figure 9:
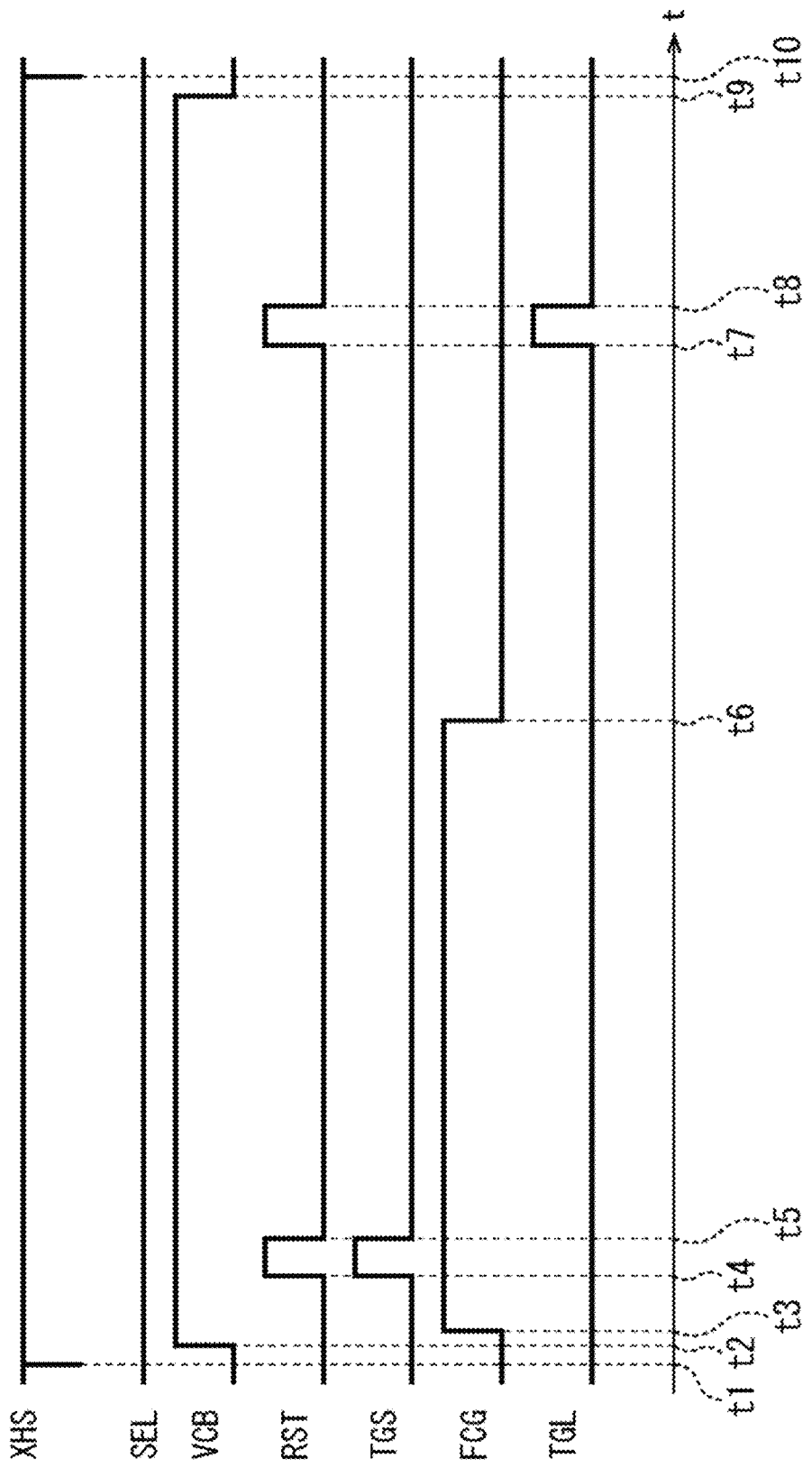
FIG. 9 is a timing chart explaining an operation at the time of start of exposure of the unit pixel of FIG. 8.
Figure 10:
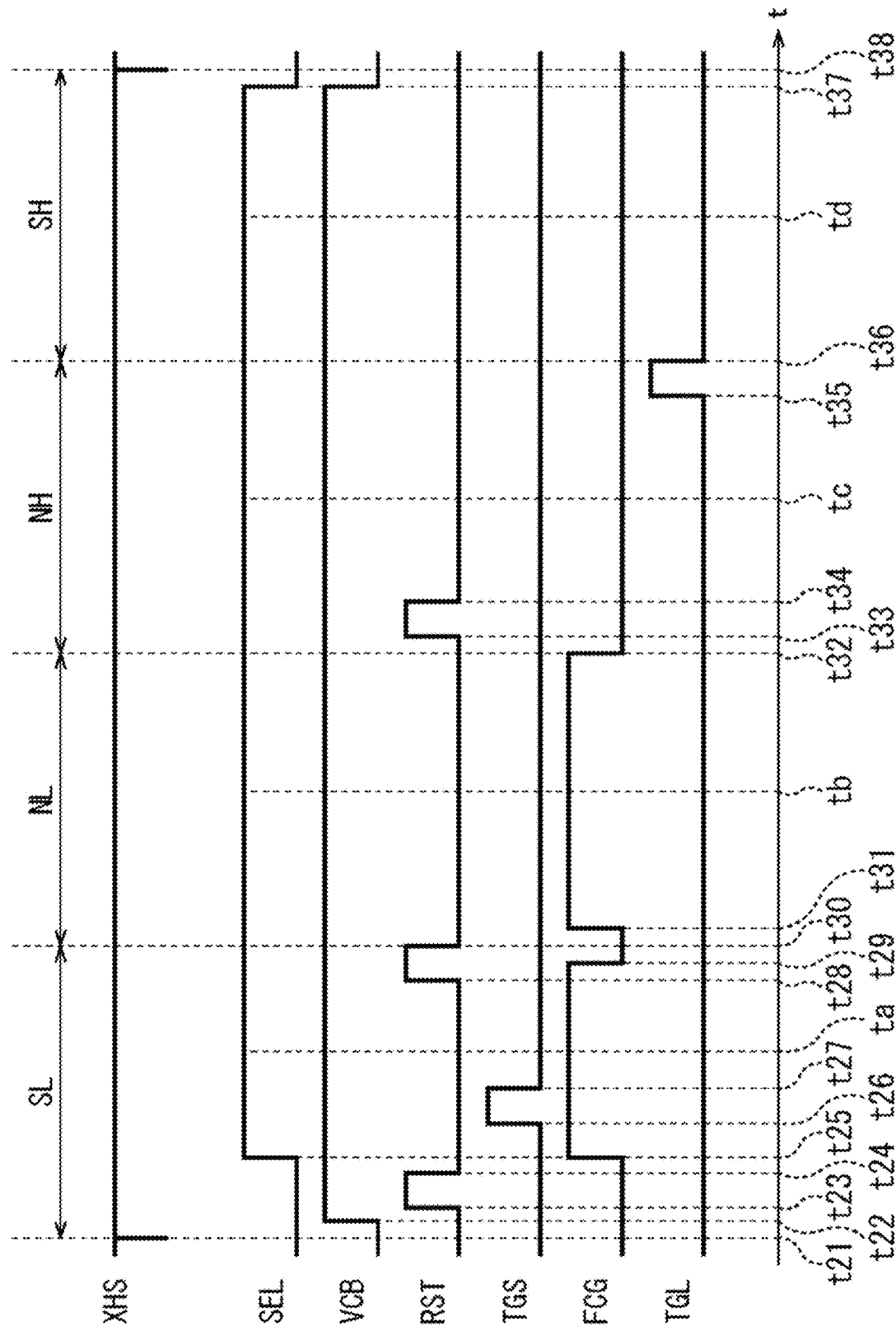
FIG. 10 is a timing chart explaining an operation at the time of start of reading from the unit pixel of FIG. 8.

Next, a second embodiment of the present technique will be described with reference to FIG. 8 to FIG. 10.

{Circuit Configuration of Unit Pixel 100C}

Figure 8:
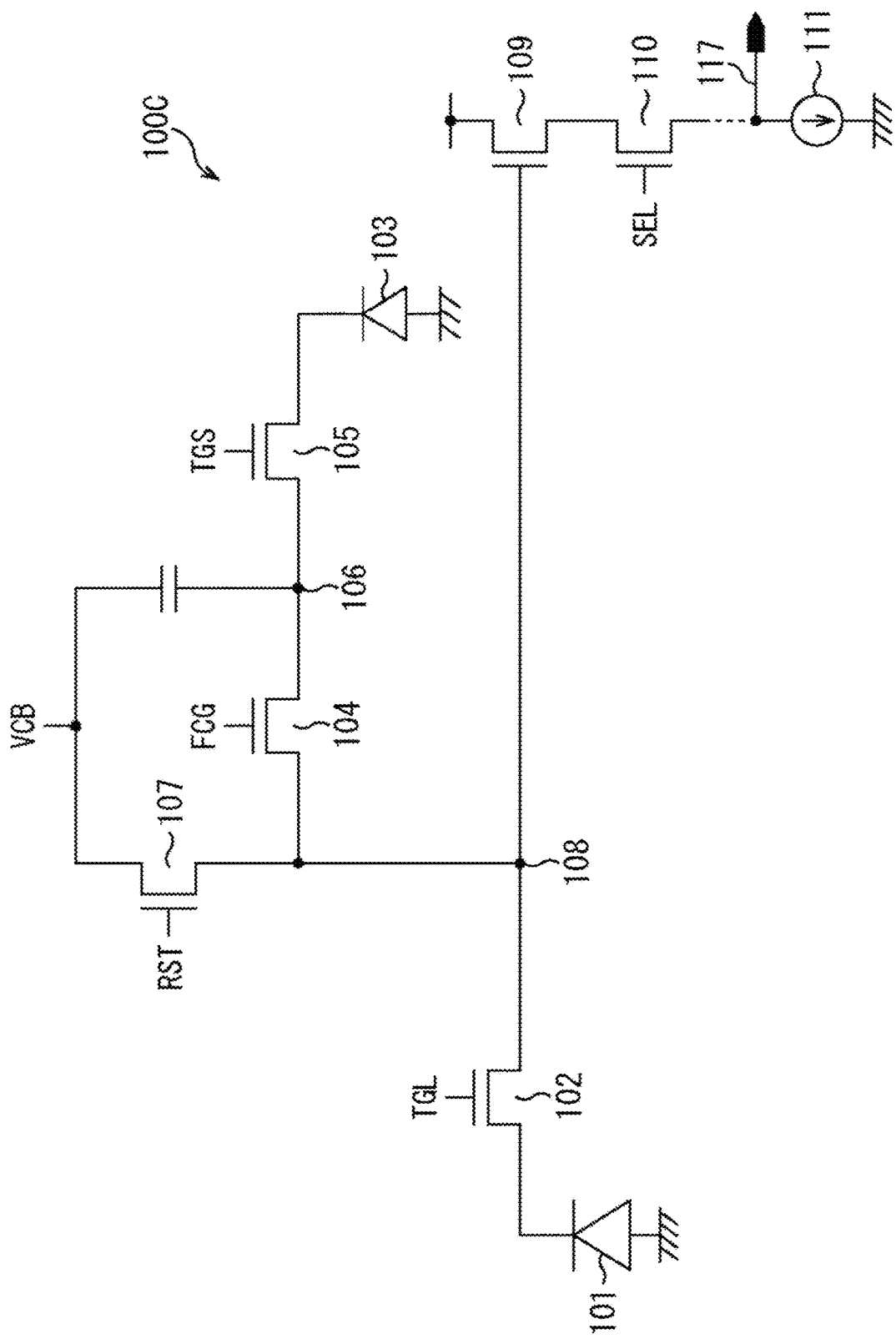
FIG. 8 is a circuit diagram depicting an example of a configuration of a unit pixel in a second embodiment of the present technique.

FIG. 8 is a circuit diagram depicting an example of a configuration of a unit pixel 100C which is arranged in the pixel array portion 11 of FIG. 1 to FIG. 3. It should be noted that in the figure, portions corresponding to those of FIG. 4 are assigned the same reference symbols, and a description thereof is suitably omitted here.

When the unit pixel 100C is compared with the unit pixel 100A of FIG. 4, the unit pixel 100C is different from the unit pixel 100A of FIG. 4 in that the counter electrode of the electric charge accumulating portion 106 and the reset gate portion 107 are each connected to a variable voltage power source VCB instead of the power source VDD. The power source voltage VCB of the variable voltage power source VCB, for example, is set to a voltage VH at a High level, or a voltage VL at a Low level. For example, the voltage VH is set to the level similar to the power source voltage VDD, and the voltage VL is set to the ground level.

{Operation of Unit Pixel 100C}

Next, an operation of the unit pixel 100C will be described with reference to timing charts of FIG. 9 and FIG. 10.

(Operation at Time of Start of Exposure of Unit Pixel 100C)

Firstly, an operation at the time of start of the exposure of the unit pixel 100C will be described with reference to the timing chart of FIG. 9. This processing, for example, is executed in predetermined scanning order every pixel row, or plurality of pixel rows in the pixel array portion 11. It should be noted that FIG. 9 depicts the timing chart of the horizontal synchronizing signal XHS, the drive signal SEL, the power source voltage VCB, and the drive signals RST, TGS, FCG, and TGL.

Firstly, at the time t1, the horizontal synchronizing signal XHS is inputted and processing for the exposure of the unit pixel 100A is started.

Next, at the time t2, the power source voltage VCB is changed from the voltage VL over to the voltage VH.

Thereafter, for a period of time ranging from the time t3 to the time t8, while the power source voltage VCB is kept set to the voltage VH, the operations similar to those from the time t2 to the time t7 of FIG. 5 are carried out.

Next, at the time t9, the power source voltage VCB is changed from the voltage VH over to the voltage VL.

Then, at the time t10, the horizontal synchronizing signal XHS is inputted.

(Operation at Time of Reading from Unit Pixel 100C)

Next, an operation at the time of reading out the pixel signal from the unit pixel 100C will be described with reference to the timing chart of FIG. 10. This processing, for example, is executed in a predetermined scanning order after a lapse of predetermined time after the processing of FIG. 9 is executed every pixel row, or every plurality of pixel rows in the pixel array portion 11. It should be noted that FIG. 10 depicts the timing chart of the horizontal synchronizing signal XHS, the drive signal SEL, the power source voltage VCB, and the drive signals RST, TGS, FCG, and TGL.

Firstly, at the time t21, the horizontal synchronizing signal XHS is inputted, and a period of time for the reading from the unit pixel 100C is started.

Next, at the time t22, the power source voltage VCB is changed from the voltage VL over to the voltage VH.

Thereafter, after for a period of time from the time t23 to the time td, the operations similar to those from the time t23 to the time td of FIG. 6 are carried out, at the time t37, the drive signal SEL is turned OFF, and the selection transistor 110 is turned OFF. As a result, the unit pixel 100A becomes the non-selection state. In addition, the power source voltage VCB is changed from the voltage VH over to the voltage VL.

Next, time t38, the horizontal synchronizing signal XHS is inputted, and the period of time for reading out the pixel signal from the unit pixel 100C.

In the unit pixel 100C, during a period of time for which the electric charges are accumulated in the electric charge accumulating portion 106 until the reading is started after the exposure is started, the power source voltage VCB is set to the voltage VL. As a result, an electric field which is applied to the electric charge accumulating portion 106 for the period of time for which the electric charges are accumulated in the electric charge accumulating portion 106 is relaxed, and a dark current occurring in the electric charge accumulating portion 106 is suppressed.

4. Third Embodiment

Next, a third embodiment of the present technique will be described with reference to FIG. 11 to FIG. 13.

{Circuit Configuration of Unit Pixel 100D}

Figure 11:
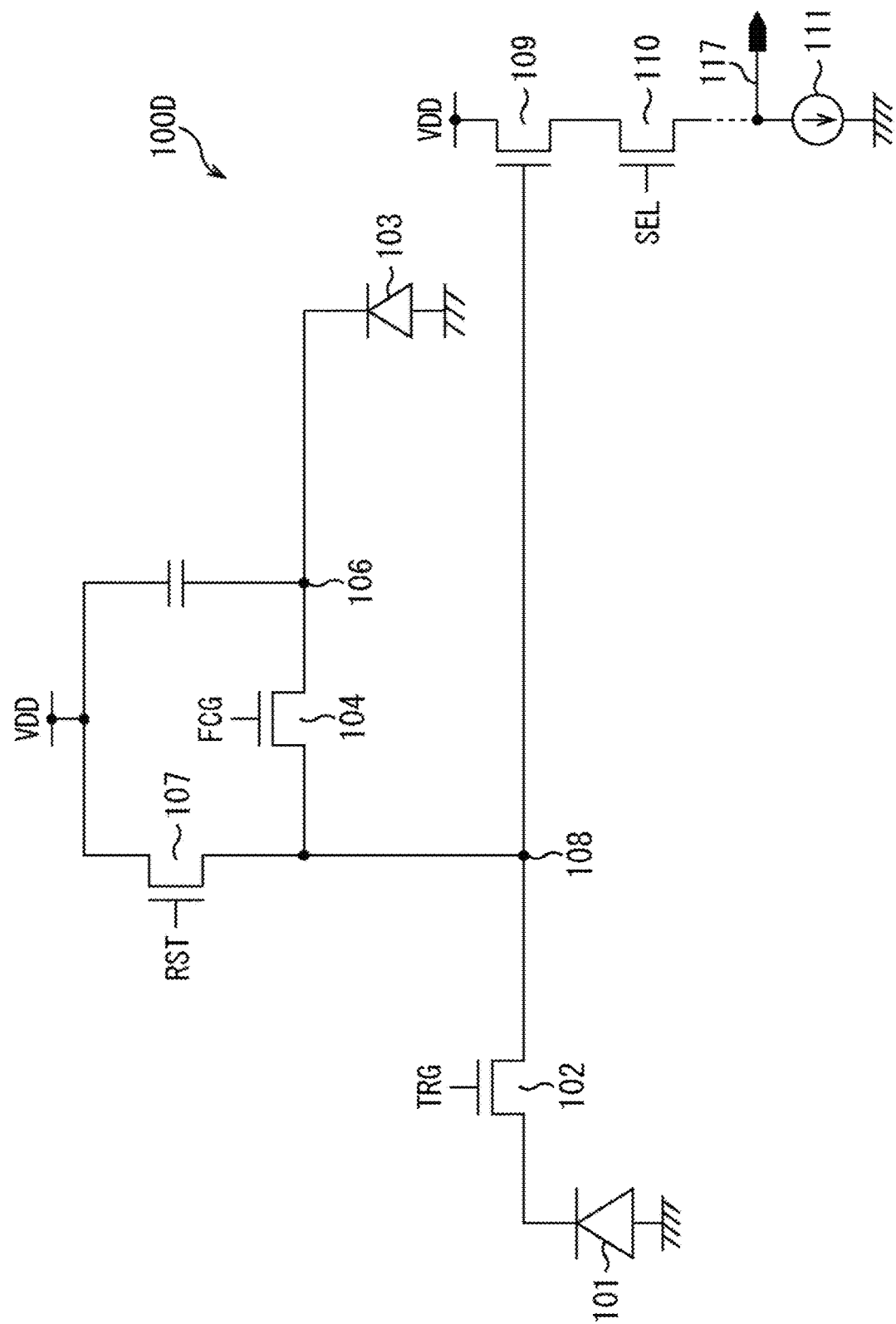
FIG. 11 is a circuit diagram depicting an example of a configuration of a unit pixel in a third embodiment of the present technique.

FIG. 11 is a circuit diagram depicting an example of a configuration of a unit pixel 100D which is arranged in the pixel array portion 11 of FIG. 1 to FIG. 3. It should be noted that portions corresponding to those of FIG. 4 are assigned the same reference symbols, and a description thereof is suitably omitted here.

When the unit pixel 100D is compared with the unit pixel 100A of FIG. 4, the unit pixel 100D is different from the unit pixel 100A of FIG. 4 in that the third transfer gate portion 105 is deleted. That is, the second photoelectric conversion portion 103 is directly connected to the electric charge accumulating portion 106 without going through the third transfer gate portion 105. Therefore, the electric charges produced in the second photoelectric conversion portion 103 are transferred to the electric charge accumulating portion 106 and accumulated in the electric charge accumulating portion 106.

In addition, instead of the drive signal TGL, the drive signal TRG is applied to the first transfer gate portion 102. It should be noted that the drive signal TRG is a signal similar to the drive signal TGL.

{Operation of Unit Pixel 100D}

Next, an operation of the unit pixel 100D will be described with reference to timing charts of FIG. 12 and FIG. 13.

(Operation at Time of Start of Exposure of Unit Pixel 100D)

Firstly, an operation at the time of start of the exposure of the unit pixel 100D will be described with reference to the timing chart of FIG. 12. This processing, for example, is executed in predetermined scanning order every pixel row, or every plurality of pixel rows in the pixel array portion 11. It should be noted that FIG. 12 depicts the timing chart of the horizontal synchronizing signal XHS, and the drive signals SEL, RST, FCG, and TRG.

Firstly, at the time t1, the horizontal synchronizing signal XHS is inputted, and the processing for the exposure of the unit pixel 100A is started.

Next, at the time t2, the drive signal FCG is turned ON, and the second transfer gate portion 104 is turned ON.

As a result, the potentials of the electric charge accumulating portion 106 and the FD portion 108 are coupled to each other.

Next, at the time t3, the drive signal RST is turned ON, and the reset gate portion 107 is turned ON. As a result, the area in which the potentials of the electric charge accumulating portion 106 and the FD portion 108 are coupled to each other is reset.

Next, at the time t4, the drive signal RST is turned OFF, and the reset gate portion 107 is turned OFF. As a result, the accumulation of the electric charges in the second photoelectric conversion portion 103 is started, and the period of time for the exposure is started.

Next, at the time t5, the drive signal FCG is turned OFF, and the second transfer gate portion 104 is turned OFF. As a result, the electric charge accumulating portion 106 starts to accumulate the electric charges transferred thereto from the second photoelectric conversion portion 103.

Next, at the time t6, the drive signals RST and TRG are each turned ON, and the reset gate portion 107 and the first transfer gate portion 102 are each turned ON. As a result, the electric charges accumulated in the first photoelectric conversion portion 101 are transferred to the FD portion 108 through the first transfer gate portion 102. Then, the FD portion 108 is reset.

Next, at the time t7, the drive signals RST and TRG are each turned OFF, and the reset gate portion 107 and the first transfer gate portion 102 are each turned OFF. As a result, the accumulation of the electric charges in the first photoelectric conversion portion 101 is started.

Then, at the time t8, the horizontal synchronizing signal XHS is inputted.

(Operation at Time of Reading from Unit Pixel 100D)

Next, an operation at the time of reading out the pixel signal from the unit pixel 100D will be described with reference to the timing chart of FIG. 13. This processing, for example, is executed in predetermined scanning order after a lapse of predetermined time after the processing of FIG. 12 is executed every pixel row, or every plurality of pixel rows in the pixel array portion 11. It should be noted that FIG. 13 depicts the timing chart of the horizontal synchronizing signal XHS, and the drive signals SEL, RST, FCG, and TRG.

Firstly, at the time t21, the horizontal synchronizing signal XHS is inputted, and a period of time for the reading from the unit pixel 100D is started.

Next, at the time t22, the drive signal RST is turned ON, and the reset gate portion 107 is turned ON. As a result, the electric potential of the FD portion 108 is reset to the level of the power source voltage VDD.

Next, at the time t23, the drive signal RST is turned OFF, and the reset gate portion 107 is turned OFF.

Next, at the time t24, the drive signals SEL and FCG are each turned ON, and the selection transistor 110 and the second transfer gate portion 104 are each turned ON. As a result, the unit pixel 100A becomes the selection state, and the potentials of the electric charge accumulating portion 106 and the FD portion 108 are coupled to each other. Then, the electric charges which are produced by the second photoelectric conversion portion 103 during the period of time for the exposure, and are accumulated in the electric charge accumulating portion 106 are accumulated in the coupling area.

At this time t24, the reading of the pixel signal is started, and the period of time for the exposure is ended.

Thereafter, for a period of time from the time ta to the time tc, an operation similar to that for a period of time from the time ta to the time tc of FIG. 6 is carried out.

Next, at the time t32, the drive signal TRG is turned ON, and the first transfer gate portion 102 is turned ON. As a result, the electric charges which are produced and accumulated in the first photoelectric conversion portion 101 during the period of time for the exposure are transferred to the FD portion 108 through the first transfer gate portion 102.

Next, at the time t33, the drive signal TRG is turned OFF, and the first transfer gate portion 102 is turned OFF. As a result, the transfer of the electric charges from the first photoelectric conversion portion 101 to the FD portion 108 is stopped.

After that, after for a period of time from the time td to the time t35, an operation similar to that for the period of time from the time td to the time t37 of FIG. 6 is carried out, the period of time for reading out the pixel signal from the unit pixel 100D is ended.

Since in the unit pixel 100D, the second transfer gate portion 104 is deleted, an area efficiency of the arrangement of the elements configuring the unit pixel 100D is enhanced. For example, an area of a light receiving surface of the first photoelectric conversion portion 101 can be increased, and the sensitivity of the first photoelectric conversion portion 101 can be enhanced.

5. Fourth Embodiment

Next, a fourth embodiment of the present technique will be described with reference to FIG. 14 to FIG. 16.

{Circuit Configuration of Unit Pixel 100E}

Figure 14:
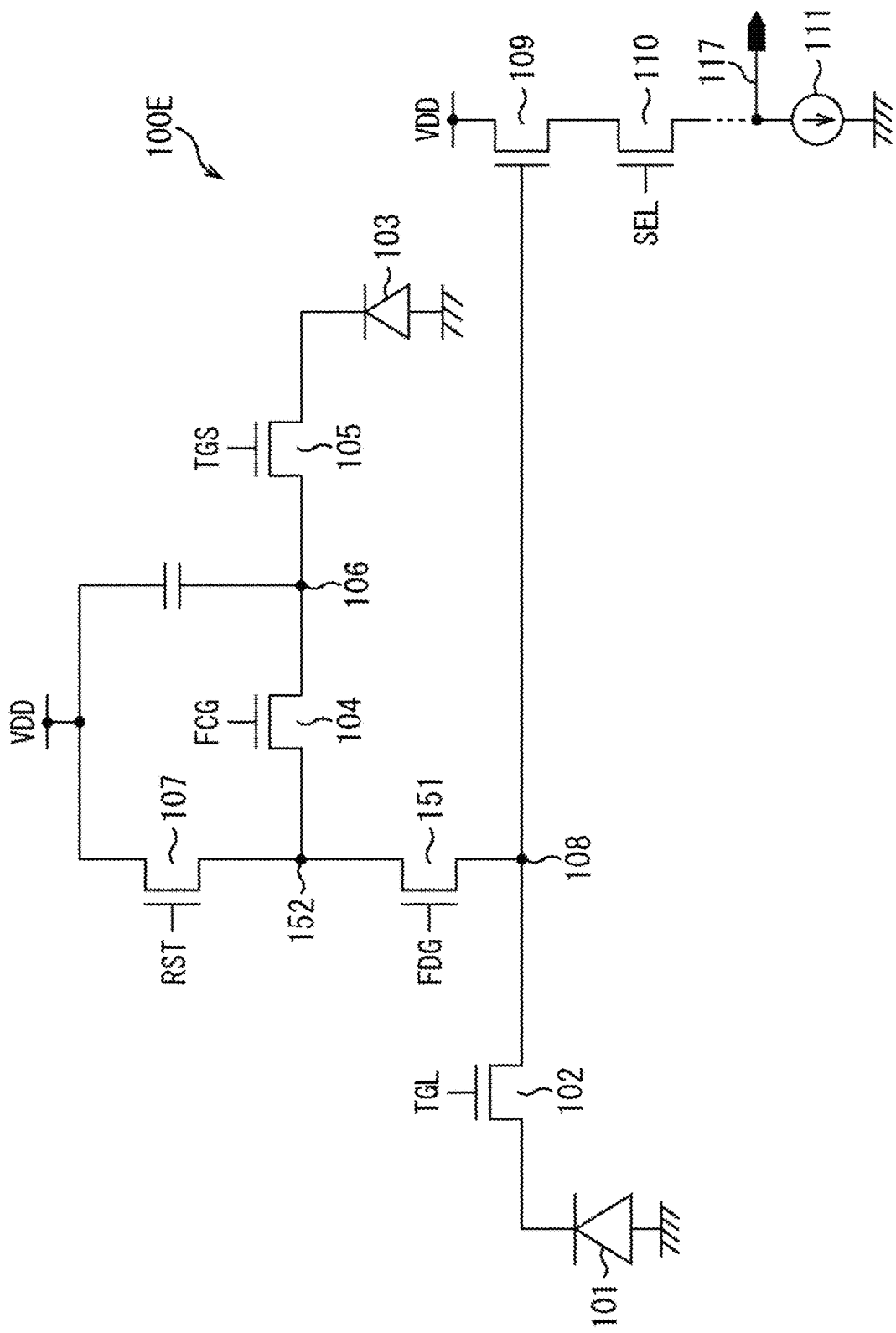
FIG. 14 is a circuit diagram depicting an example of a configuration of a unit pixel in a fourth embodiment of the present technique.

FIG. 14 is a circuit diagram depicting an example of a configuration of a unit pixel 100E which is arranged in the pixel array portion 11 of FIG. 1 to FIG. 3. It should be noted that in the figure, portions corresponding to those of FIG. 4 are assigned the same reference symbols, and a description thereof is suitably omitted here.

When the unit pixel 100E of FIG. 14 is compared with the unit pixel 100A of FIG. 4, the unit pixel 100E is different from the unit pixel 100A of FIG. 4 in that a fourth transfer gate portion 151 is added. The fourth transfer gate portion 151 is connected between the second transfer gate portion 104 and the reset gate portion 107, and the FD portion 108. The drive signal FDG is applied to a gate electrode of the fourth transfer gate portion 151. When the drive signal FDG becomes the active state, the fourth transfer gate portion 151 becomes the conduction state, and the potentials of a node 152 among the second transfer gate portion 104, the reset gate portion 107 and the fourth transfer gate portion 151, and the FD portion 108 are coupled to each other.

{Operation of Unit Pixel 100E}

Next, an operation of the unit pixel 100E will be described with reference to timing charts of FIG. 15 and FIG. 16.

(Operation at Time of Start of Exposure of Unit Pixel 100E)

Firstly, an operation at the time of start of the exposure of the unit pixel 100E will be described with reference to the timing chart of FIG. 15. This processing, for example, is executed in predetermined scanning order every pixel row, or every plurality of pixel rows in the pixel array portion 11. It should be noted that FIG. 15 depicts the timing chart of the horizontal synchronizing signal XHS, and the drive signals SEL, FDG, RST, TGS, FCG, and TGL.

Firstly, at the time t1, the horizontal synchronizing signal XHS is inputted, and the processing for exposure of the unit pixel 100A is started.

Next, at the time t2, the drive signals FDG and FCG are each turned ON, and the fourth transfer gate portion 151 and the second transfer gate portion 104 are each turned ON. As a result, the potentials of the electric charge accumulating portion 106, the FD portion 108, and the node 152 are coupled to one another.

After that, for a period of time from the time t3 to the time t8, while the drive signal FDG is kept turned ON and the fourth transfer gate portion 151 is kept turned ON, the operation similar to that for the period of time from the time t3 to the time t8 of FIG. 5 is carried out.

(Operation at Time of Reading from Unit Pixel 100E)

Next, an operation at the time of reading out the pixel signal from the unit pixel 100E will be described with reference to the timing chart of FIG. 16. This processing, for example, is executed in predetermined scanning order after a lapse of predetermined time after the processing of FIG. 15 is executed every pixel row, or every plurality of pixel rows in the pixel array portion 11. It should be noted that FIG. 16 depicts the timing chart of the horizontal synchronizing signal XHS, and the drive signals SEL, FDG, RST, TGS, FCG, and TGL.

Firstly, at the time t21, the horizontal synchronizing signal XHS is inputted, and a period of time for the reading from the unit pixel 100E is started.

Next, at the time t22, the drive signal FDG is turned ON, and the fourth transfer gate portion 151 is turned ON. As a result, the potentials of the FD portion 108 and the node 152 are coupled to each other.

Thereafter, after for a period of time from the time t23 to the time tb, the operation similar to that for a period of time from the time t22 to the time tb of FIG. 6 is carried out, at the time t32, the drive signals FCG and FDG are each turned OFF, and the second transfer gate portion 104 and the fourth transfer gate portion 151 are each turned OFF. In addition, the drive signal RST is turned ON, and the reset gate portion 107 is turned ON.

Next, at the time t33, the drive signal FDG is turned ON, and the fourth transfer gate portion 151 is turned ON. As a result, the potentials of the FD portion 108 and the node 152 are coupled to each other. In addition, since the reset gate portion 107 is turned ON, the coupling area is reset.

Next, at the time t34, the drive signal FDG is turned OFF, and the fourth transfer gate portion 151 is turned OFF.

After that, after for a period of time from the time tc to the time td, the operation similar to that for the period of time from the time tc to the time td of FIG. 6 is carried out, at the time t37, the drive signal RST is turned OFF, and the reset gate portion 107 is turned OFF.

After that, after for a period of time from the time t38 to the time t39, the operation similar to that for the period of time from the time t36 to the time t37 of FIG. 6 is carried out, the period of time for the reading from the unit pixel 100E is ended.

6. Fifth Embodiment

Figure 18:
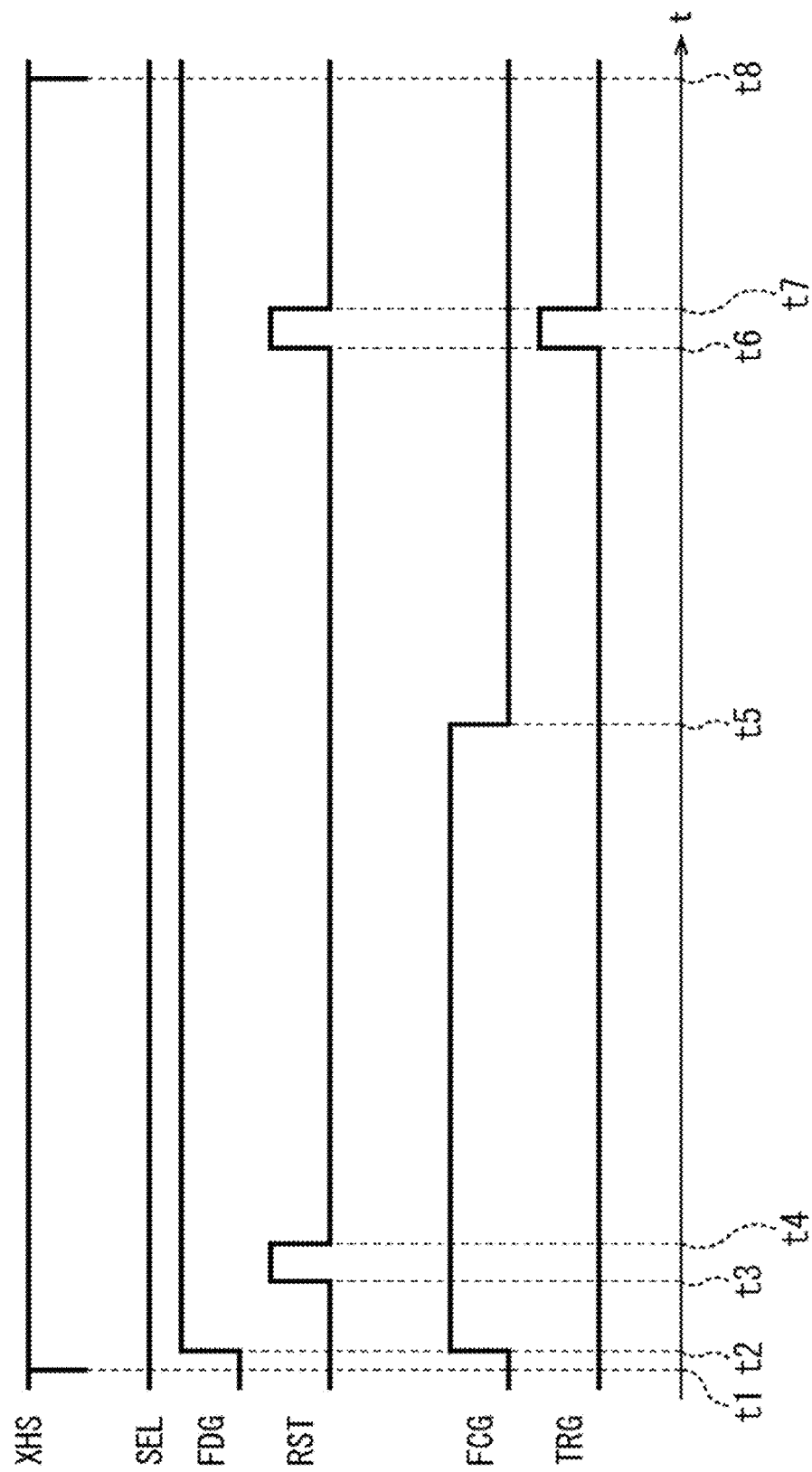
FIG. 18 is a timing chart explaining an operation at the time of start of exposure of the unit pixel of FIG. 17.
Figure 19:
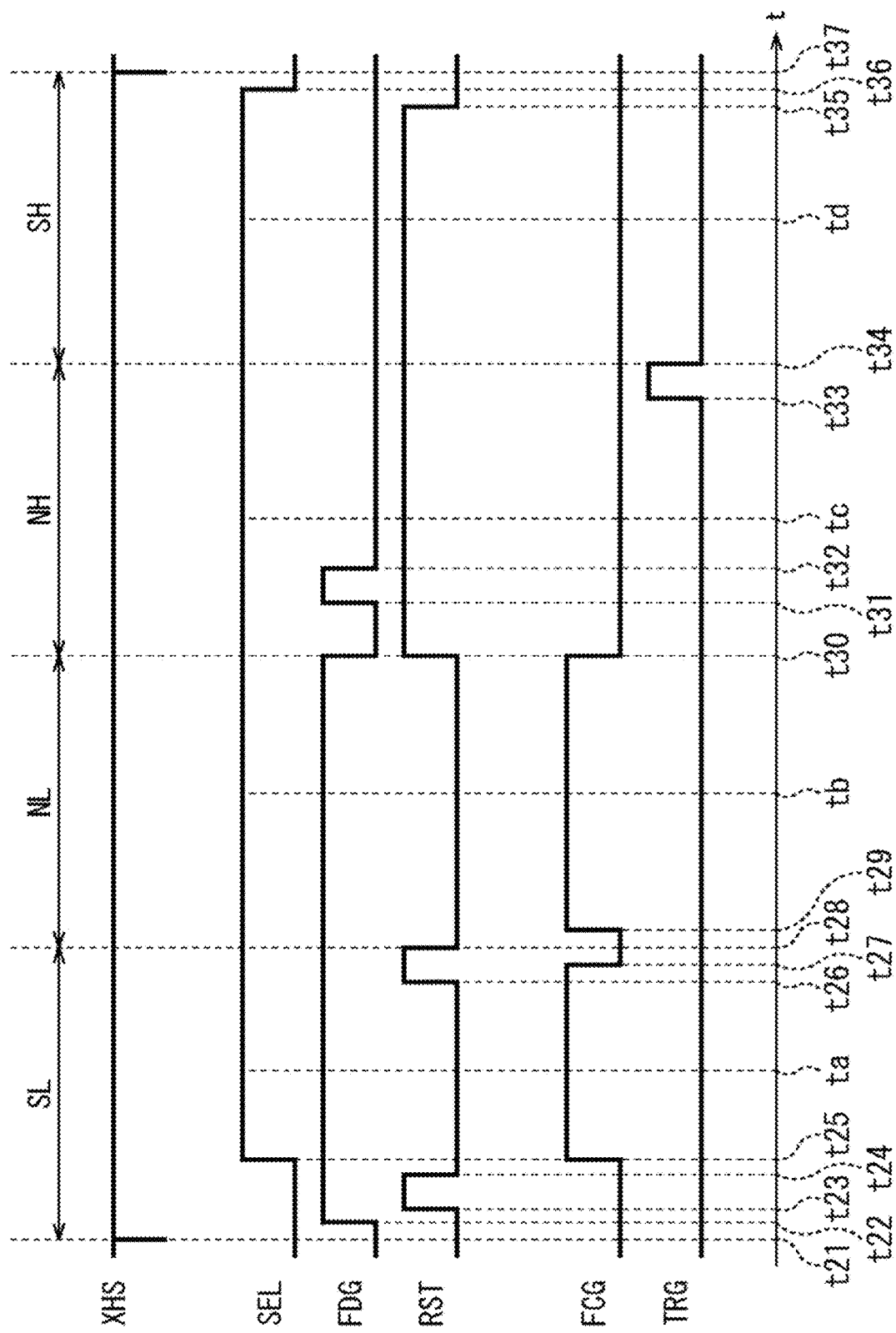
FIG. 19 is a timing chart explaining an operation at the time of start of reading from the unit pixel of FIG. 17.

Next, a fifth embodiment of the present technique will be described with reference to FIG. 17 to FIG. 19.

{Circuit Configuration of Unit Pixel 100F}

Figure 17:
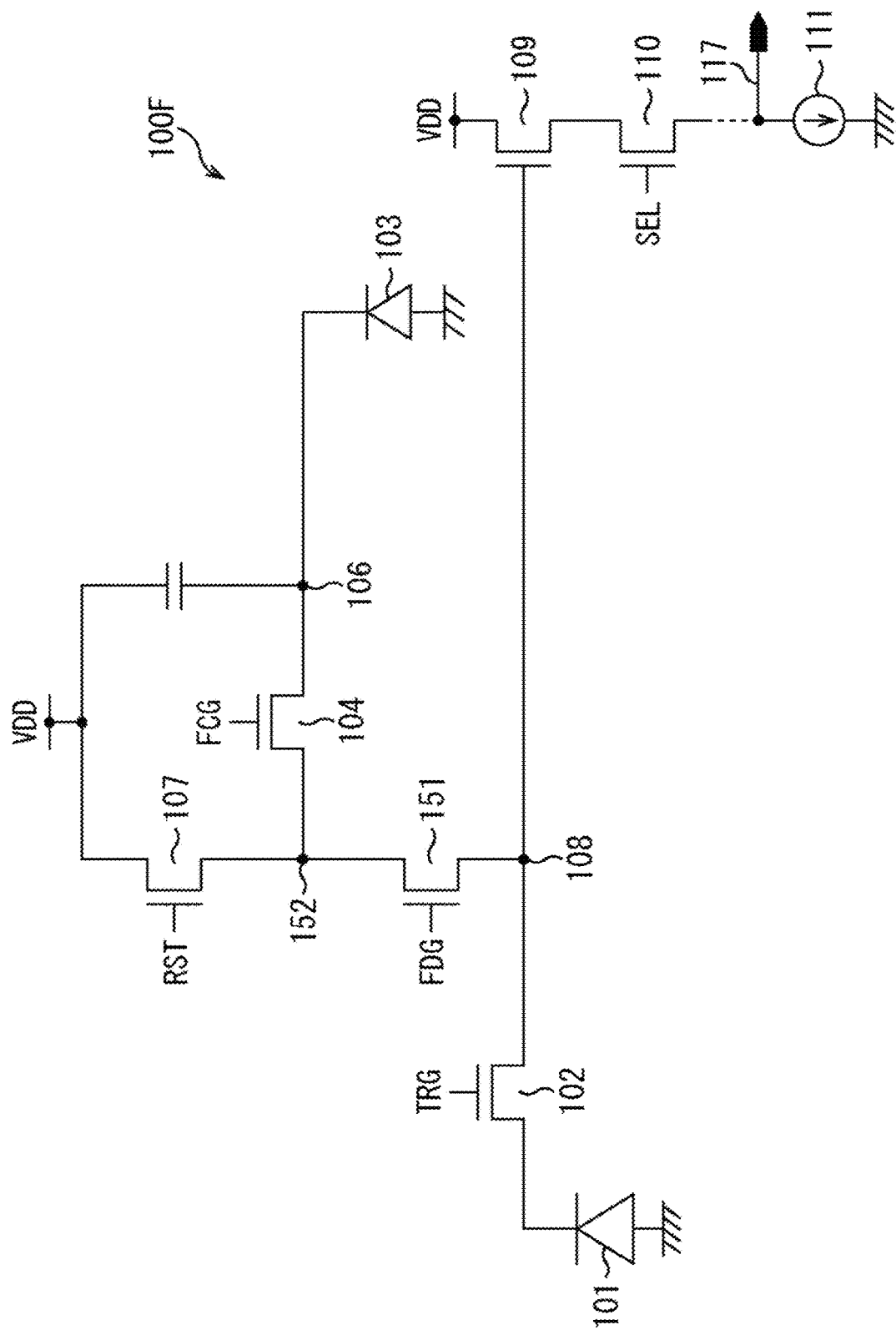
FIG. 17 is a circuit diagram depicting an example of a configuration of a unit pixel in a fifth embodiment of the present technique.

FIG. 17 is a circuit diagram depicting an example of a configuration of a unit pixel 100F which is arranged in the pixel array portion 11 of FIG. 1 to FIG. 3. It should be noted that in the figure, portions corresponding to those of FIG. 14 are assigned the same reference symbols, and a description thereof is suitably omitted here.

When the unit pixel 100F is compared with the unit pixel 100E of FIG. 14, the unit pixel 100F is different from the unit pixel 100E of FIG. 14 in that the third transfer gate portion 105 is deleted. That is, the second photoelectric conversion portion 103 is directly connected to the electric charge accumulating portion 106 without going through the third transfer gate portion 105. Therefore, the unit pixel 100F has such a configuration that the fourth transfer gate portion 151 is added to the unit pixel 100D of FIG. 11.

{Operation of Unit Pixel 100F}

Next, an operation of the unit pixel 100F will be described with reference to timing charts of FIG. 18 and FIG. 19.

(Operation at Time of Start of Exposure of Unit Pixel 100F)

Firstly, an operation at the time of start of the exposure of the unit pixel 100F will be described with reference to the timing chart of FIG. 18. This processing, for example, is executed in predetermined scanning order every pixel row, or every plurality of pixel rows in the pixel array portion 11. It should be noted that FIG. 18 depicts the timing chart of the horizontal synchronizing signal XHS, and the drive signals SEL, FDG, RST, FCG, and TRG.

Firstly, at the time t1, the horizontal synchronizing signal XHS is inputted, and processing for exposing the unit pixel 100A is started.

Next, at the time t2, the drive signals FDG and FCG are each turned ON, and the fourth transfer gate portion 151 and the second transfer gate portion 104 are each turned ON. As a result, the potentials of the electric charge accumulating portion 106, the FD portion 108, and the node 152 are coupled to one another.

Figure 12:
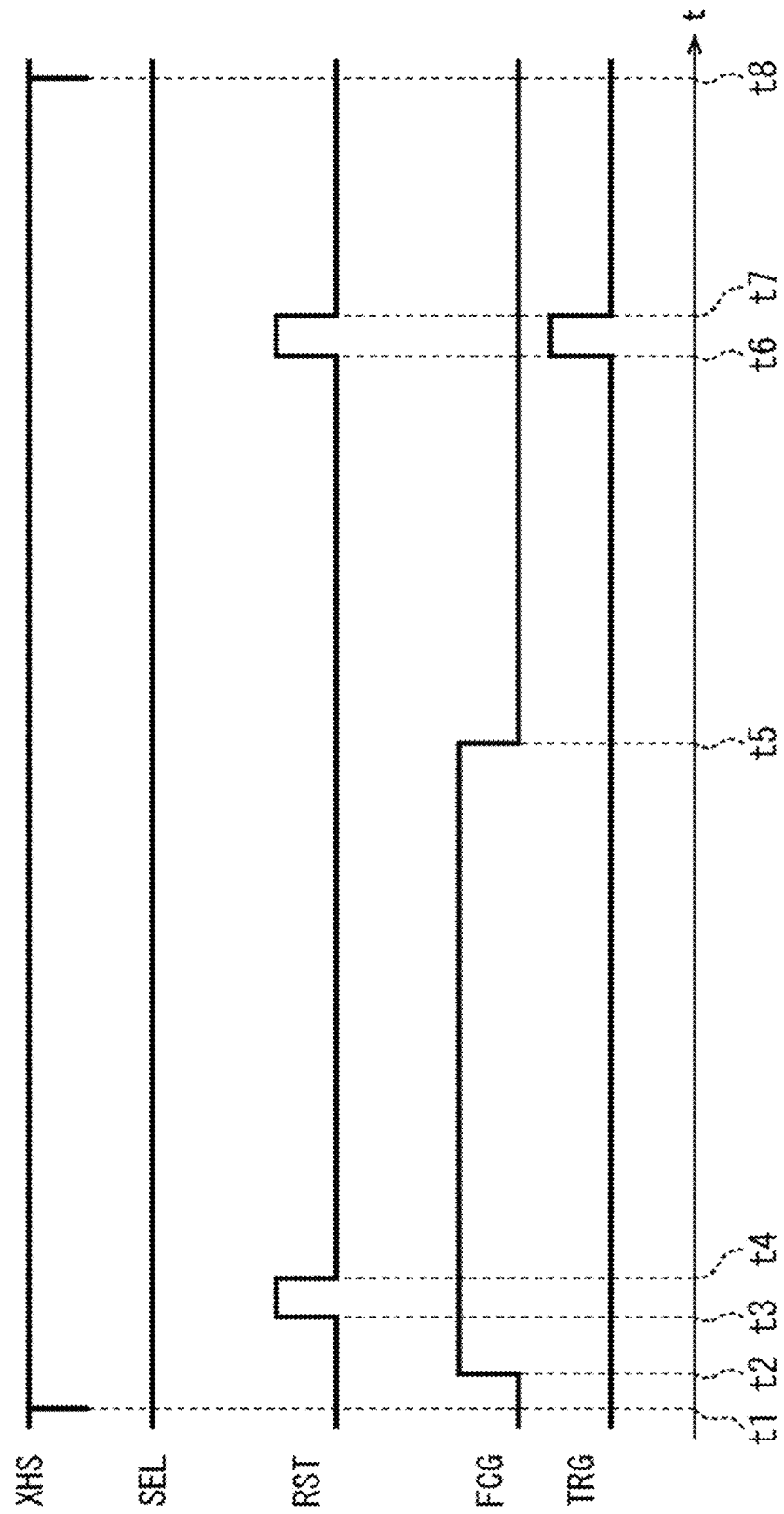
FIG. 12 is a timing chart explaining an operation at the time of start of exposure of the unit pixel of FIG. 11.

After that, while for a period of time from the time t3 to the time t8, the drive signal FDG is kept turned ON, and the fourth transfer gate portion 151 is kept turned ON, the operation similar to that for the period of time from the time t3 to the time t8 of FIG. 12 is carried out.

(Operation at Time of Reading from Unit Pixel 100F)

Next, an operation at the time of reading out the pixel signal from the unit pixel 100F will be described with reference to the timing chart of FIG. 19. This processing, for example, is executed in predetermined scanning order after a lapse of predetermined time after the processing of FIG. 18 is executed every pixel row, or every plurality of pixel rows in the pixel array portion 11. It should be noted that FIG. 19 depicts the timing chart of the horizontal synchronizing signal XHS, and the drive signals SEL, FDG, RST, FCG, and TRG.

Firstly, at the time t21, the horizontal synchronizing signal XHS is inputted, and the period of time for the reading from the unit pixel 100F is started.

Next, at the time t22, the drive signal FDG is turned ON, and the fourth transfer gate portion 151 is turned ON. As a result, the potentials of the FD portion 108 and the node 152 are coupled to each other.

Figure 13:
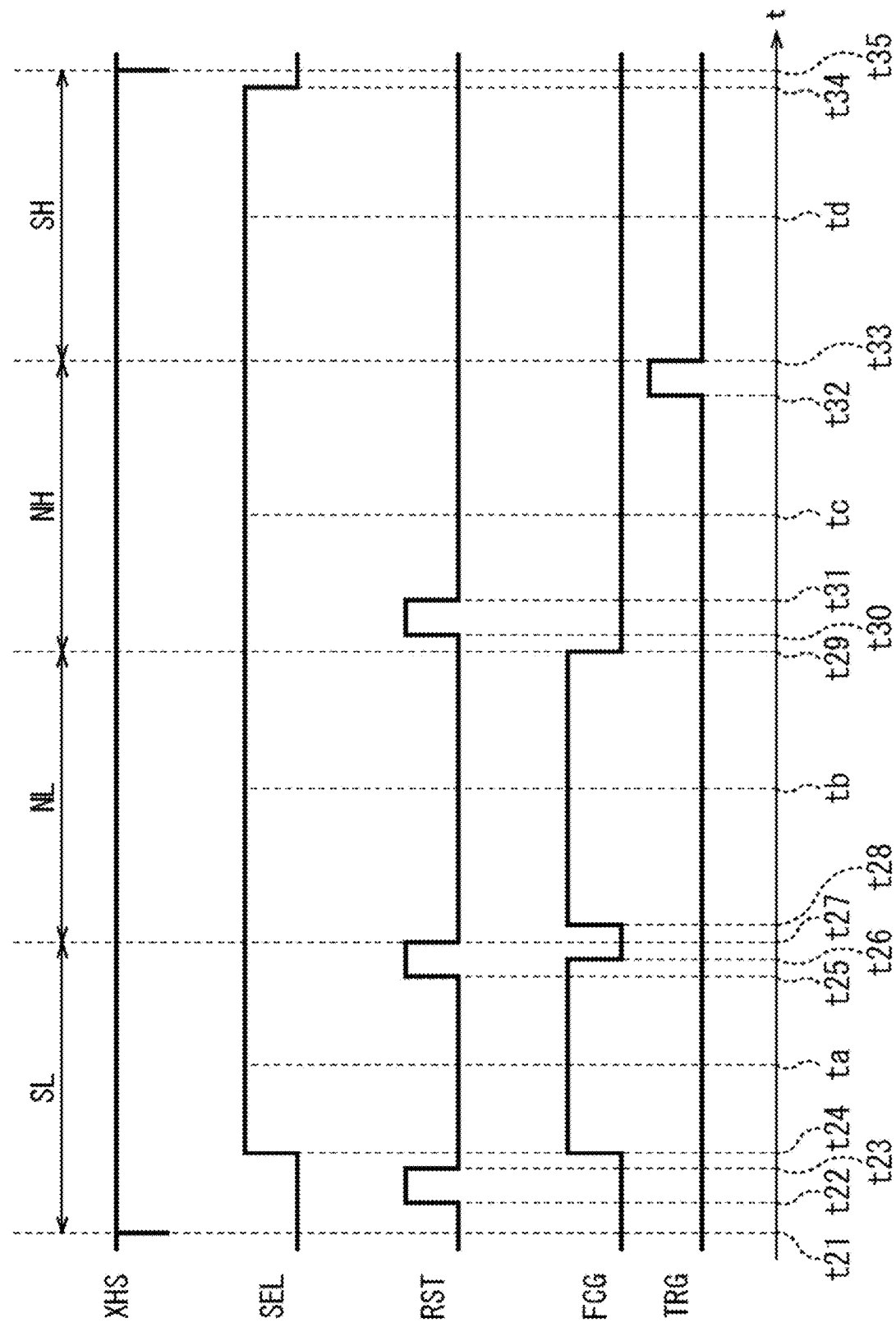
FIG. 13 is a timing chart explaining an operation at the time of start of reading from the unit pixel of FIG. 11.
Figure 16:
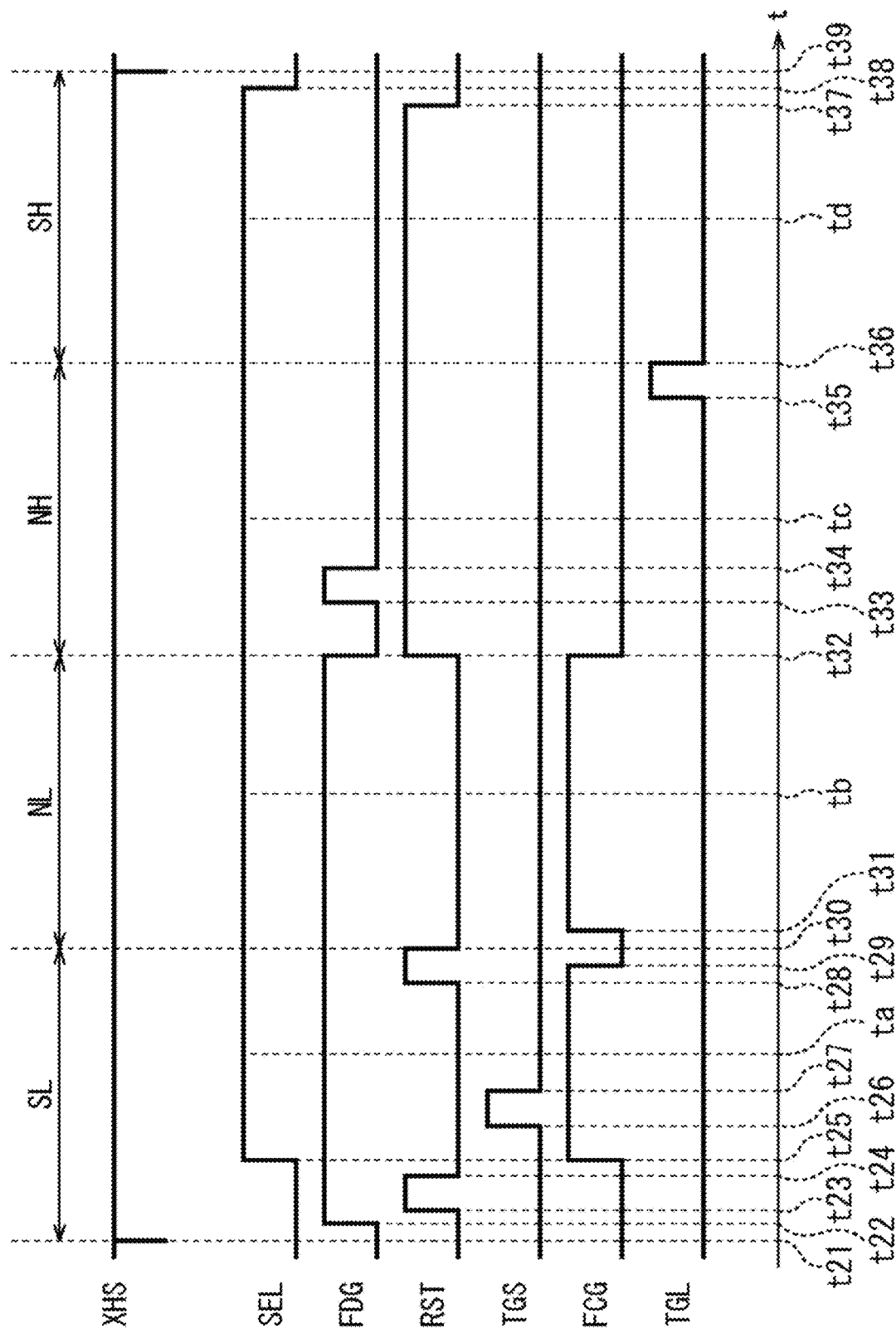
FIG. 16 is a timing chart explaining an operation at the time of start of reading from the unit pixel of FIG. 14.

After that, for the period of time from the time t23 to the time tb, the operation similar to that for the period of time from the time t22 to the time tb of FIG. 13 is carried out, and for the period of time from the time t30 to the time t37, the operation similar to that for the period of time from the time t32 to the time t39 of FIG. 16 is carried out. Thereafter, the period of time for the reading from the unit pixel 100F is ended.

7. Sixth Embodiment

Next, a sixth embodiment of the present technique will be described with reference to FIG. 20 to FIG. 25.

{Circuit Configuration of Unit Pixel 100G}

Figure 20:
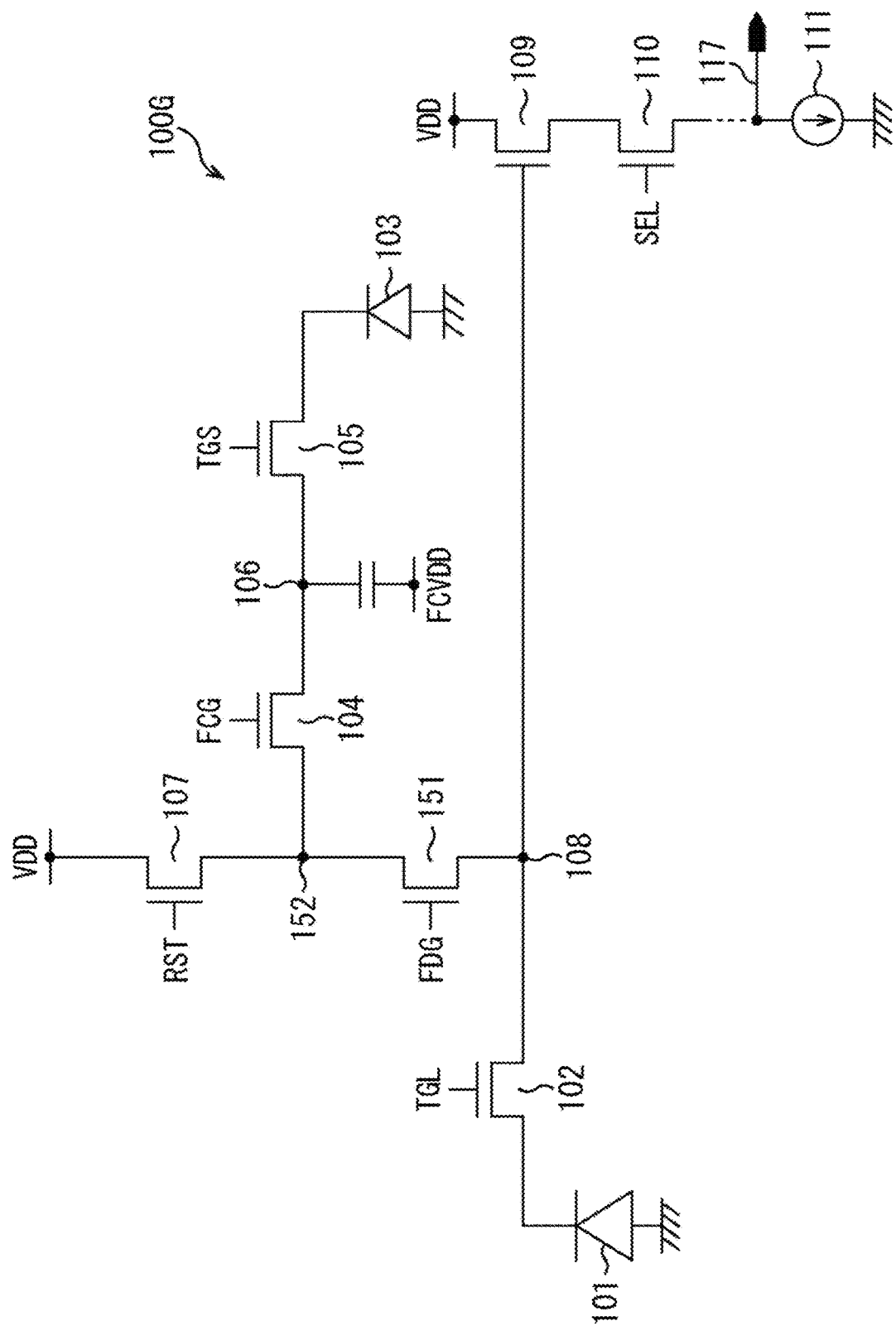
FIG. 20 is a circuit diagram depicting an example of a configuration of a unit pixel in a sixth embodiment of the present technique.

FIG. 20 is a circuit diagram depicting an example of a configuration of a unit pixel 100G which is arranged in the pixel array portion 11 of FIG. 1 to FIG. 3. It should be noted that in the figure, portions corresponding to those of FIG. 14 are assigned the same reference symbols, and a description thereof is suitably omitted here.

When the unit pixel 100G is compared with the unit pixel 100E of FIG. 14, the unit pixel 100G is different from the unit pixel 100E of FIG. 14 in that a connection position of the counter electrode of the electric charge accumulating portion 106 is different. That is, the unit pixel 100G is different from the unit pixel 100E of FIG. 14 in that in the unit pixel 100G, the counter electrode of the electric charge accumulating portion 106 is connected to the variable voltage power source FCVDD. The power source voltage FCVDD of the variable voltage power source FCVDD, for example, is set to a voltage FCH at a High level, or the voltage FCL at a Low level. For example, the voltage FCH is set to approximately the same level as the power source voltage VDD, and the voltage FCL is set to a predetermined intermediate electric potential.

{Example of Configuration of Portion Producing Voltage FCH of Variable Voltage Power Source FCVDD}

Figure 21:
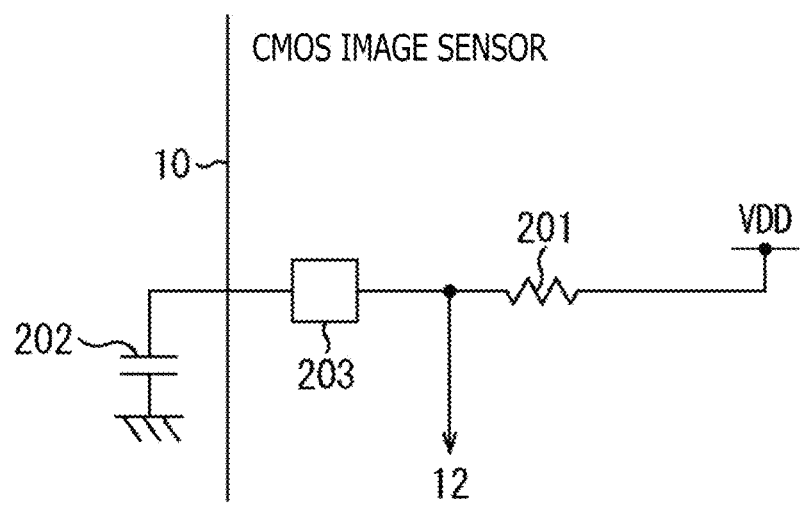
FIG. 21 is a circuit diagram depicting an example of a first configuration of a portion producing a voltage on a High level side of a variable voltage power source.
Figure 22:
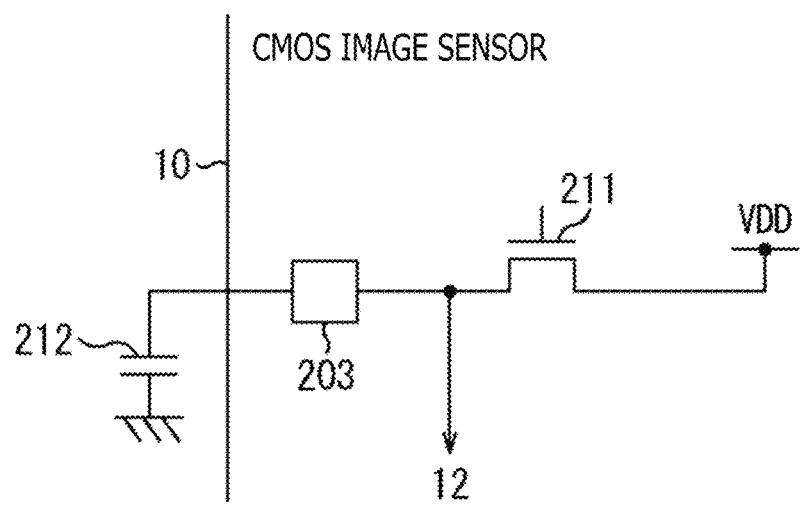
FIG. 22 is a circuit diagram depicting an example of a second configuration of a portion producing a voltage on a High level side of a variable voltage power source.

FIG. 21 and FIG. 22 depict examples of a configuration of a portion producing the voltage FCH of the variable voltage power source FCVDD.

In the example of FIG. 21, the portion producing the voltage FCH of the variable voltage power source FCVDD includes the power source VDD, a resistor 201 and a capacitor 202. The resistor 201 is connected between the power source VDD and a chip type pad 203 provided with the CMOS image sensor 10. One end on a side of the resistor 201 connected to the pad 203 is also connected to the vertical drive portion 12. The capacitor 202 is an external capacitor connected to the pad 203, and is connected between the pad 203 and the ground.

Then, the resistor 201 and the capacitor 202 configure a low-pass filter. The voltage FCH is outputted through the low-pass filter to be supplied to the vertical drive portion 12. Therefore, a high-frequency noise of the voltage FCH is rejected, and a PSRR (power supply rejection ratio) is largely improved.

The example of FIG. 22 is different from the example of FIG. 21 in that a switch 211 is connected instead of the resistor 201 and a capacitor 212 is connected instead of the capacitor 202. The switch 211 and the capacitor 212 configure a sample-and-hold circuit. The voltage FCH is outputted through the sample-and-hold circuit to be supplied to the vertical drive portion 12.

Then, for example, the system control portion 15 controls the switch 211 so as to adjust the electric charge accumulation amount of the capacitor 212, thereby adjusting the voltage FCH. That is, the voltage FCH of the variable voltage power source FCVDD is prescribed by the electric charges accumulated in the capacitor 212. Therefore, the high-frequency noise of the voltage FCH is rejected, and the PSRR is largely improved.

{Operation of Unit Pixel 100G}

Figure 23:
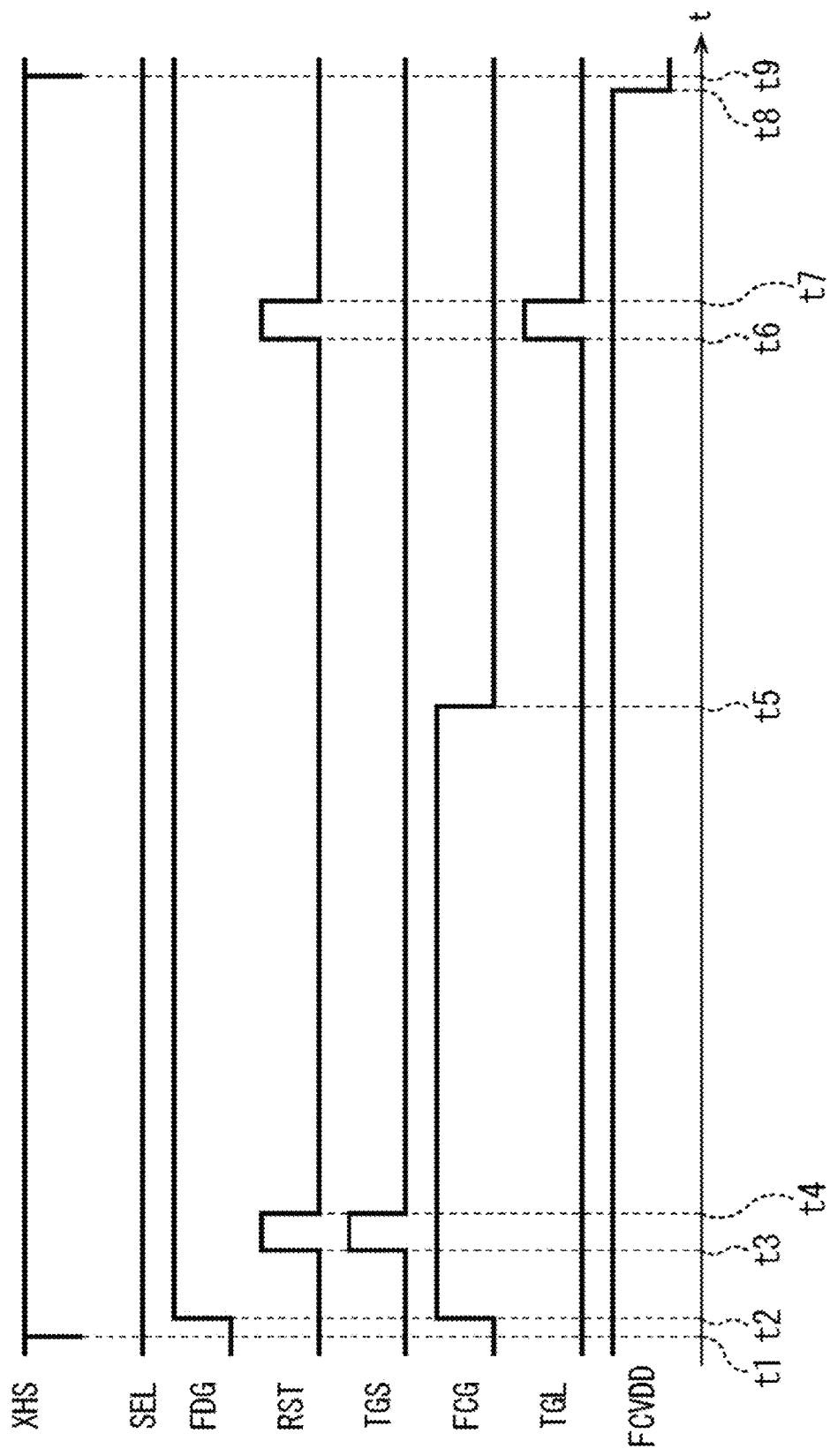
FIG. 23 is a timing chart explaining an operation at the time of start of exposure of the unit pixel of FIG. 20.
Figure 24:
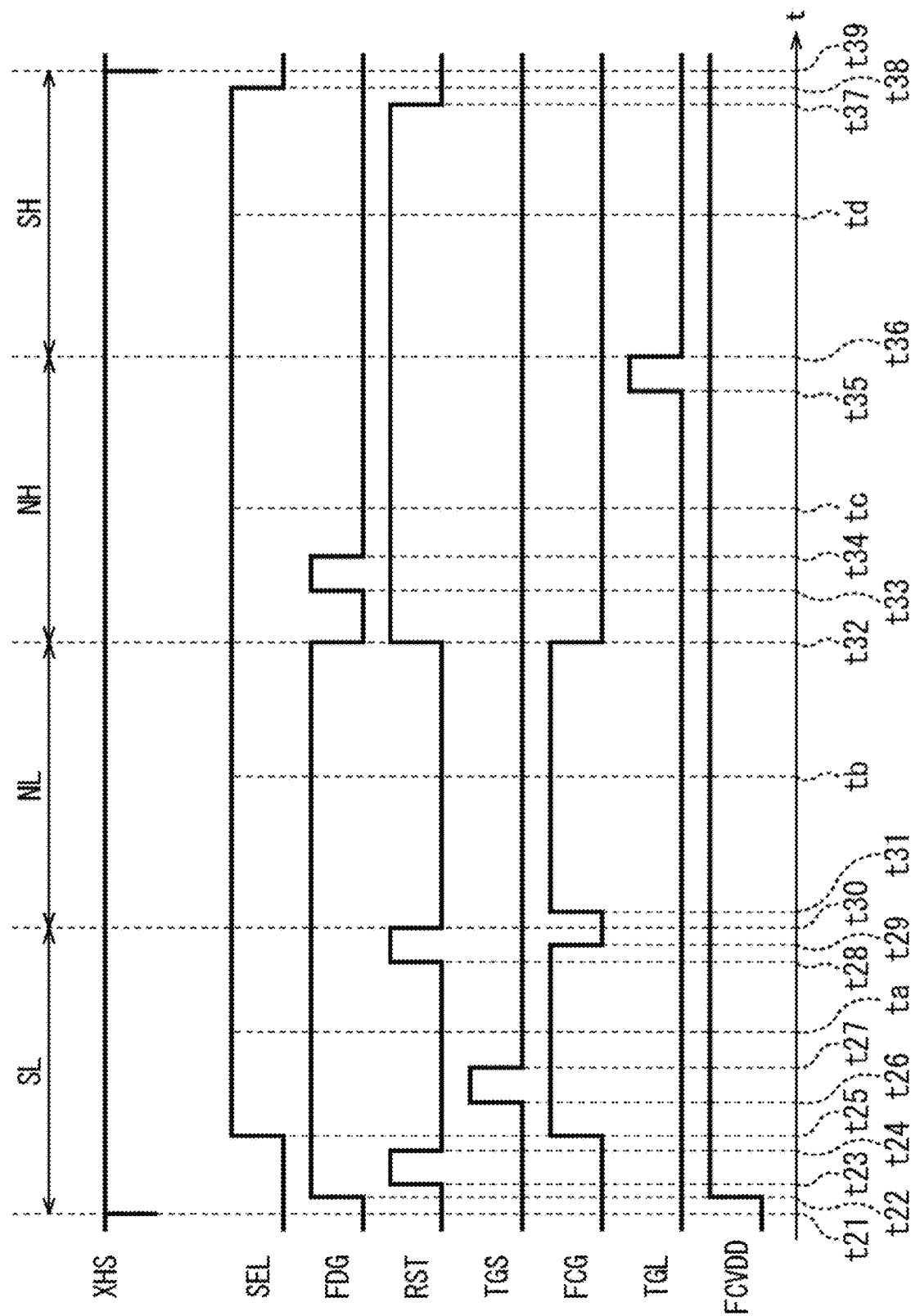
FIG. 24 is a timing chart explaining an operation at the time of start of reading from the unit pixel of FIG. 20.

Next, an operation of the unit pixel 100G will be described with reference to timing charts of FIG. 23 to FIG. 25.

(Operation at Time of Start of Exposure of Unit Pixel 100G)

Firstly, an operation at the time of start of the exposure of the unit pixel 100G will be described with reference to the timing chart of FIG. 23. This processing, for example, is executed in predetermined scanning order every pixel row, or every plurality of pixel rows in the pixel array portion 11. It should be noted that FIG. 23 depicts the timing chart of the horizontal synchronizing signal XHS, the drive signals SEL, FDG, RST, TGS, FCG, and TGL, and the power source voltage FCVDD.

Figure 15:
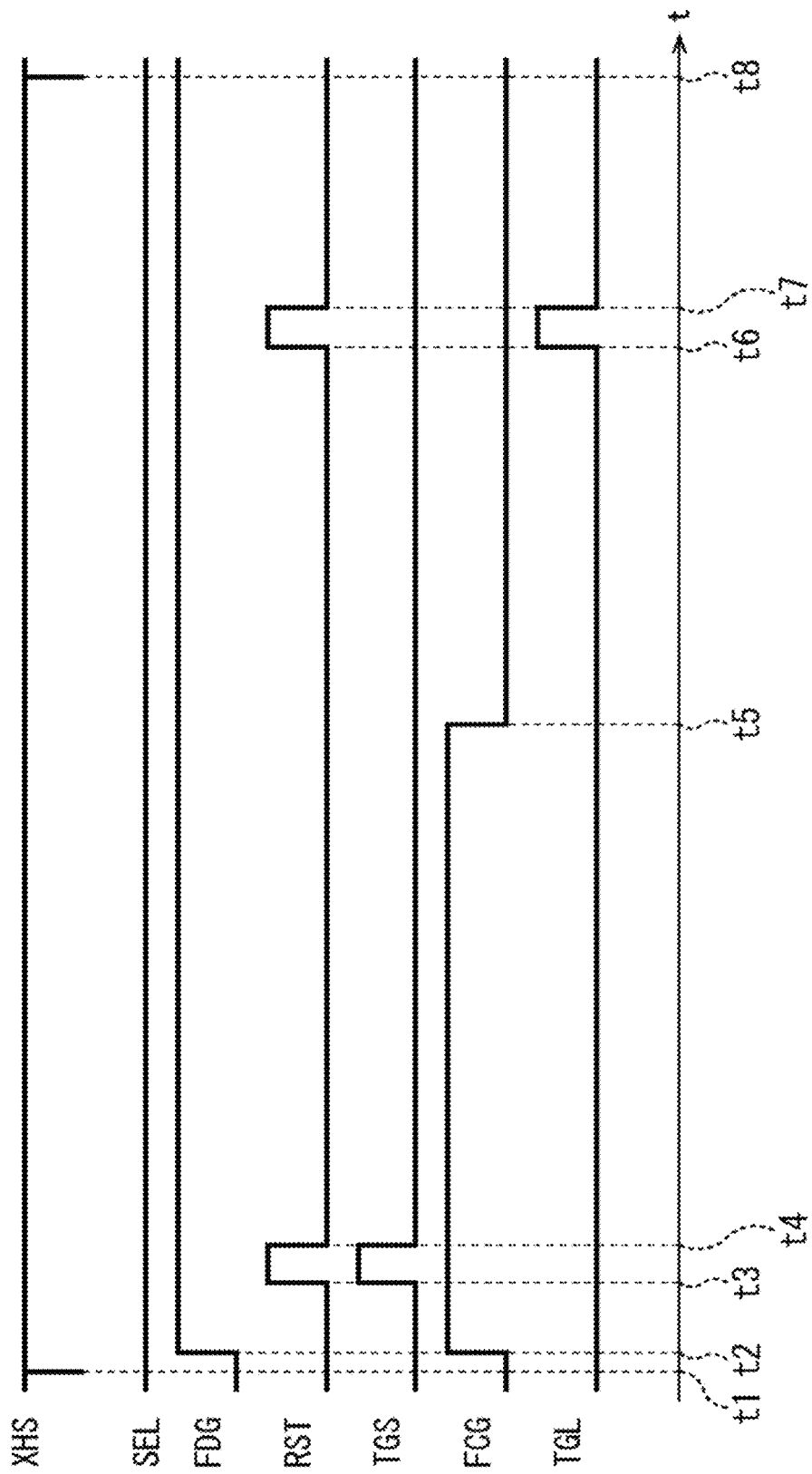
FIG. 15 is a timing chart explaining an operation at the time of start of exposure of the unit pixel of FIG. 14.

For a period of time from the time t1 to the time t7, the operation similar to that for the period of time from the time t1 to the time t7 of FIG. 15 is carried out. It should be noted that for this period of time, the power source voltage FCVDD is kept set to the voltage FCH.

At the time t8, the power source voltage FCVDD is changed from the voltage FCH over to the voltage FCL.

Then, at the time t9, the horizontal synchronizing signal XHS is inputted.

(Operation at Time of Reading from Unit Pixel 100G)

Next, an operation at the time of reading out the pixel signal from the unit pixel 100G will be described with reference to the timing chart of FIG. 24. This processing, for example, is executed in predetermined scanning order after a lapse of predetermined time after the processing of FIG. 23 is executed every pixel row, or every plurality of pixel rows in the pixel array portion 11. It should be noted that FIG. 24 depicts the timing chart of the horizontal synchronizing signal XHS, the drive signals SEL, FDG, RST, TGS, FCG, and TGL, and the power source voltage FCVDD.

Firstly, at the time t21, the horizontal synchronizing signal XHS is inputted, and a period of time for the reading from the unit pixel 100G is started.

Next, at the time t22, the drive signal FDG is turned ON, and the fourth transfer gate portion 151 is turned ON. As a result, the potentials of the FD portion 108 and the node 152 are coupled to each other. In addition, the power source voltage FCVDD is changed from the voltage FCL over to the voltage FCH.

After that, after for a period of time from the time t23 to the time t39, the operation similar to that for the period of time from the time t23 to the time t39 of FIG. 16 is carried out, a period of time for reading out the pixel signal from the unit pixel 100G is ended.

(Relationship Between Period of Time for Exposure of Unit Pixel 100G, and Power Source Voltage FCVDD)

Figure 25:
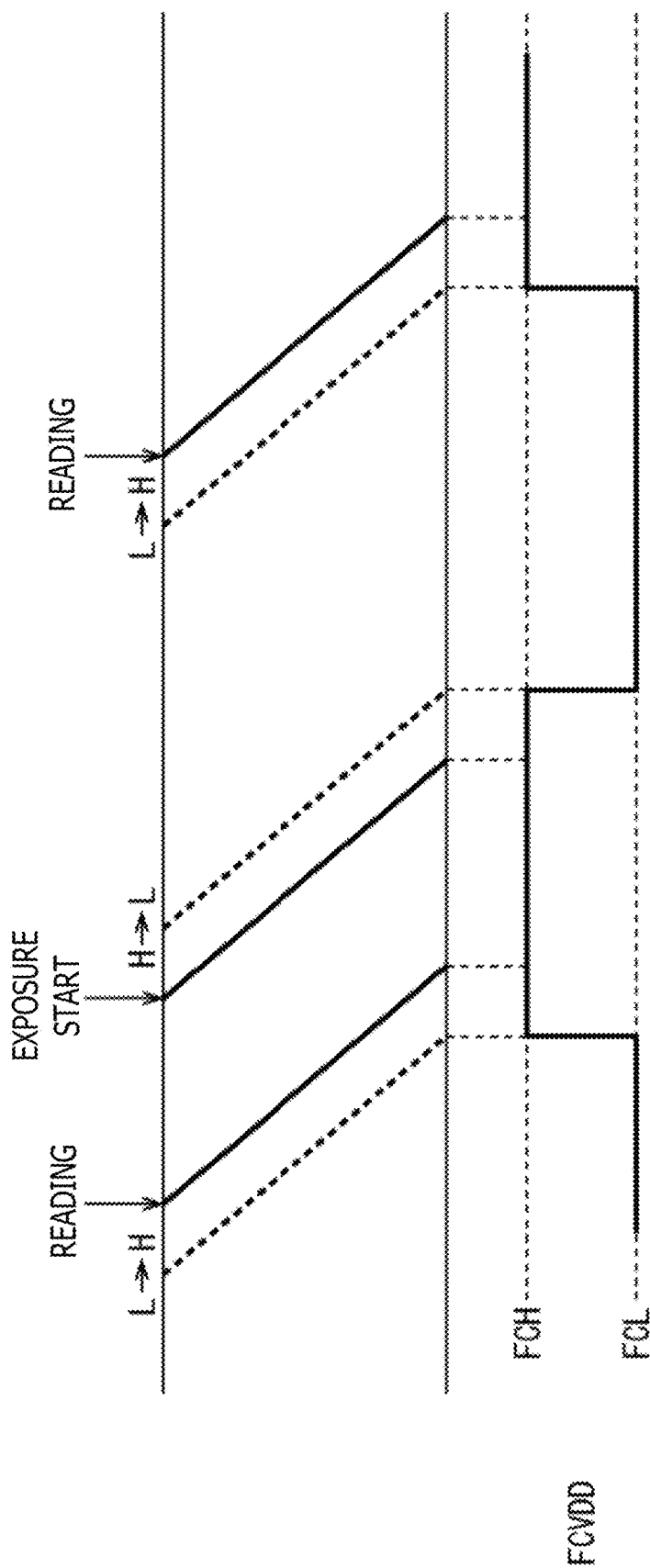
FIG. 25 is a flow chart schematically depicting a relationship between a period of time for exposure of the unit pixel of FIG. 20, and a power source voltage of a variable voltage power source.

The timing chart of FIG. 25 schematically depicts a relationship between the period of time for the exposure of the unit pixel 100G, and the power source voltage FCVDD of the variable voltage power source FCVDD.

The timing chart on an upper side of FIG. 25 schematically depicts a relationship between the period of time for the exposure of the unit pixel 100G in each of the rows from the head row to the final row in the pixel array portion 11, and the power source voltage FCVDD in order from the top. Specifically, a dotted line with which a character string "L→H" is depicted depicts a timing at which the power source voltage FCVDD in each of the rows is changed from the voltage FCL over to the voltage FCH. A dotted line with which a character string "H→L" is depicted depicts a timing at which the power source voltage FCVDD in each of the rows is changed from the voltage FCH over to the voltage FCL. A solid line with which a character string "reading" is depicted depicts a timing at which the pixel signal is read out from the unit pixel 100G in each of the rows. A solid line with which a character string "exposure start" is depicted depicts a timing at which the exposure of the unit pixel 100G in each of the rows is started.

A timing chart on a lower side of FIG. 25 depicts a timing chart of the power source voltage FCVDD of the final row in the pixel array portion 11.

As depicted in this timing chart, after the exposure of the unit pixel 100G is started in each of the rows in the pixel array portion 11, the power source voltage FCVDD is changed from the voltage FCH over to the voltage FCL. In addition, before the pixel signal is read out from the unit pixel 100G in each of the rows in the pixel array portion 11, the power source voltage FCVDD is changed from the voltage FCL over to the voltage FCH. Therefore, for approximately the entire period of time during the period of time for the exposure of the unit pixel 100G in each of the rows, the power source voltage FCVDD is kept set to the voltage FCL. As a result, the electric field applied to the electric charge accumulating portion 106 for the period of time for which the electric charges produced by the second photoelectric conversion portion 103 are accumulated in the electric charge accumulating portion 106 is relaxed, and the dark current occurring in the electric charge accumulating portion 106 is suppressed.

It should be noted that the timing at which the power source voltage FCVDD is changed is by no means limited to the example described above. Specifically, for example, it is only necessary that for at least a part of the period of time for which the electric charges produced by the second photoelectric conversion portion 103 are accumulated in the electric charge accumulating portion 106, the power source voltage FCVDD is set lower than that when the signal based on the electric charges accumulated in the electric charge accumulating portion 106 is read out.

For example, the power source voltage FCVDD can be changed from the voltage FCH over to the voltage FCL at an arbitrary timing after the exposure by the second photoelectric conversion portion 103 of the unit pixel 100G is started.

However, after the start of the exposure by the second photoelectric conversion portion 103, at the earliest possible timing, the power source voltage FCVDD is desirably changed from the voltage FCH over to the voltage FCL.

In addition, for example, at an arbitrary timing before the low-sensitivity reset signal NL of the unit pixel 100G is read out, the power source voltage FCVDD can be changed from the voltage FCL over to the voltage FCH. However, at the timing as close as possible to the timing at which the low-sensitivity reset signal NL of the unit pixel 100G is read out, the power source voltage FCVDD is desirably changed from the voltage FCL over to the voltage FCH.

Moreover, for example, for a period of time until the exposure is started after the reading of the pixel signal from the unit pixel 100G is ended, the power source voltage FCVDD may be kept set to the voltage FCL. For example, at the time t38 of FIG. 24, the power source voltage FCVDD may be changed from the voltage FCH over to the voltage FCL and at the time t2 of FIG. 23, the power source voltage FCVDD may be changed from the voltage FCL over to the voltage FCH.

8. Explanation Regarding Noise Removing Processing and Arithmetic Operation Processing The signals are outputted from the unit pixels 100A to 100F described above to the vertical signal line 17 in order of the low-sensitivity data signal SL, the low-sensitivity reset signal NL, the high-sensitivity reset signal NH, and the high-sensitivity data signal SH. Then, in the signal processing portion in the subsequent stage, for example, in the column processing portion 13 and the signal processing portion 18 depicted in FIG. 1 to FIG. 3, the predetermined noise removing processing and signal processing are executed for the low-sensitivity data signal SL, the low-sensitivity reset signal NL, the high-sensitivity reset signal NH, and the high-sensitivity data signal SH. Hereinafter, a description will be given with respect to an example of the noise removing processing in the column processing portion 13, and arithmetic operation processing in the signal processing portion 18 in the subsequent stage.

{Noise Removing Processing}

Firstly, a description will be given with respect to the noise removing processing by the column processing portion 13.

(Processing Example 1 of Noise Removing Processing)

Firstly, a description will be given with respect to processing example 1 of the noise removing processing.

Firstly, the column processing portion 13 obtains a difference between the low-sensitivity data signal SL and the low-sensitivity reset signal NL, thereby producing a low-sensitivity difference signal SNL. Therefore, the low-sensitivity difference signal SNL=the low-sensitivity data signal SL−the low-sensitivity reset signal NL is obtained.

Next, the column processing portion 13 obtains a difference between the high-sensitivity data signal SH and the high-sensitivity reset signal NH, thereby producing a high-sensitivity difference signal SNH. Therefore, the high-sensitivity difference signal SNH=the high-sensitivity data signal SH−the high-sensitivity reset signal NH is obtained.

In such a way, in the processing example 1, DDS processing is executed with which although for the low-sensitivity signals SL and NL, a fixed pattern noise peculiar to the pixel such as threshold value dispersion in the amplification transistor within the pixel is removed away, a reset noise is not removed away. With respect to the high-sensitivity signals SH and NH, CDS processing is executed with which the reset noise and the fixed pattern noise peculiar to the pixel such as threshold value dispersion in the amplification transistor within the pixel are removed away.

In addition, since the processing example 1 adopts the arithmetic operation processing which does not need to use a frame memory, there are offered the advantages that the simplification of the circuit configuration, and the cost reduction can be realized.

(Processing Example 2 of Noise Removing Processing)

Next, a description will be given with respect to processing example 2 of the noise removing processing.

In the processing example 2, since information associated with a preceding frame is used, storage means, for example, the frame memory is required. Therefore, the arithmetic operation processing of the processing example 2, for example, is executed in such a way that the data storing portion 19 is used as the storage means in the signal processing portion 18, and the frame memory is used in the external DSP circuit.

Specifically, firstly, the column processing portion 13 obtains a difference between the low-sensitivity data signal SL and the low-sensitivity reset signal NLA in the preceding frame, thereby producing the low-sensitivity difference signal SNL. Therefore, the low-sensitivity difference signal SNL=the low-sensitivity data signal SL−the low-sensitivity reset signal NLA is obtained.

Next, the column processing portion 13 obtains a difference between the high-sensitivity data signal SH and the high-sensitivity reset signal NH, thereby producing the high-sensitivity difference signal SNH. Therefore, the high-sensitivity difference signal SNH=the high-sensitivity data signal SH−the high-sensitivity reset signal NH is obtained.

In such a way, in the processing example 2, with respect to the low-sensitivity signals SL and NL as well, the CDS processing is executed with which the reset noise, and the fixed pattern noise peculiar to the pixel such as threshold value dispersion in the amplification transistor within the pixel are removed away. As a result, although the storage means such as the frame memory is required, there is offered the advantage that the reset noise can be largely suppressed as compared with the case of the processing example 1.

{Arithmetic Operation Processing for Pixel Signal}

Next, a description will be given with respect to the arithmetic operation processing for the pixel signal in the signal processing portion 18 in the first to third embodiments described above.

(Processing Example 1 of Arithmetic Operation Processing for Pixel Signal)

Firstly, processing example 1 of the arithmetic operation processing for the pixel signal will be described.

Firstly, when the low-sensitivity difference signal SNL falls within a predetermined range, the signal processing portion 18 calculates a ratio of the high-sensitivity difference signal SNH to the low-sensitivity difference signal SNL every pixel, every plurality of pixels, every color, every specific pixel within the shared pixel unit, or in uniformly all the pixels in the form of a gain to produce a gain table. Then, the signal processing portion 18 calculates the products of the low-sensitivity difference signal SNL and the gain table concerned as a correction value for the low-sensitivity difference signal SNL.

Here, when the gain is G, and a correction value of the low-sensitivity difference signal SNL (hereinafter referred to as a correction low-sensitivity difference signal) is SNL', the gain G and the correction low-sensitivity difference signal SNL' can be obtained on the basis of following Expressions (1) and (2), respectively.

$$G=SNH/SNL=(Cfd+Cfc)/Cfd \quad (1)$$

$$SNL'=G \times SNL \quad (2)$$

Here, Cfd is a capacitance value of the FD portion 108, and Cfc is a capacitance value of the electric charge accumulating portion 106. Therefore, the gain G is equivalent to a capacitance ratio.

Figure 26:
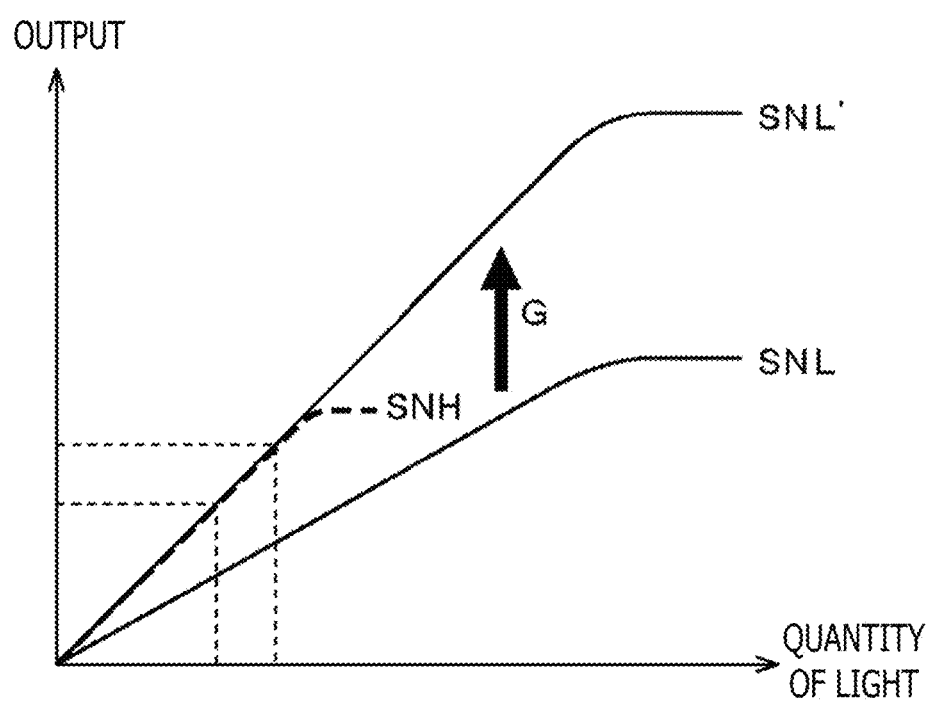
FIG. 26 is a characteristic diagram (part 1) of a quantity of incident light-output explaining signal processing.

FIG. 26 depicts a relationship among the low-sensitivity difference signal SNL, the high-sensitivity difference signal SNH, and the correction low-sensitivity difference signal SNL' to the quantity of incident light.

Figure 27:
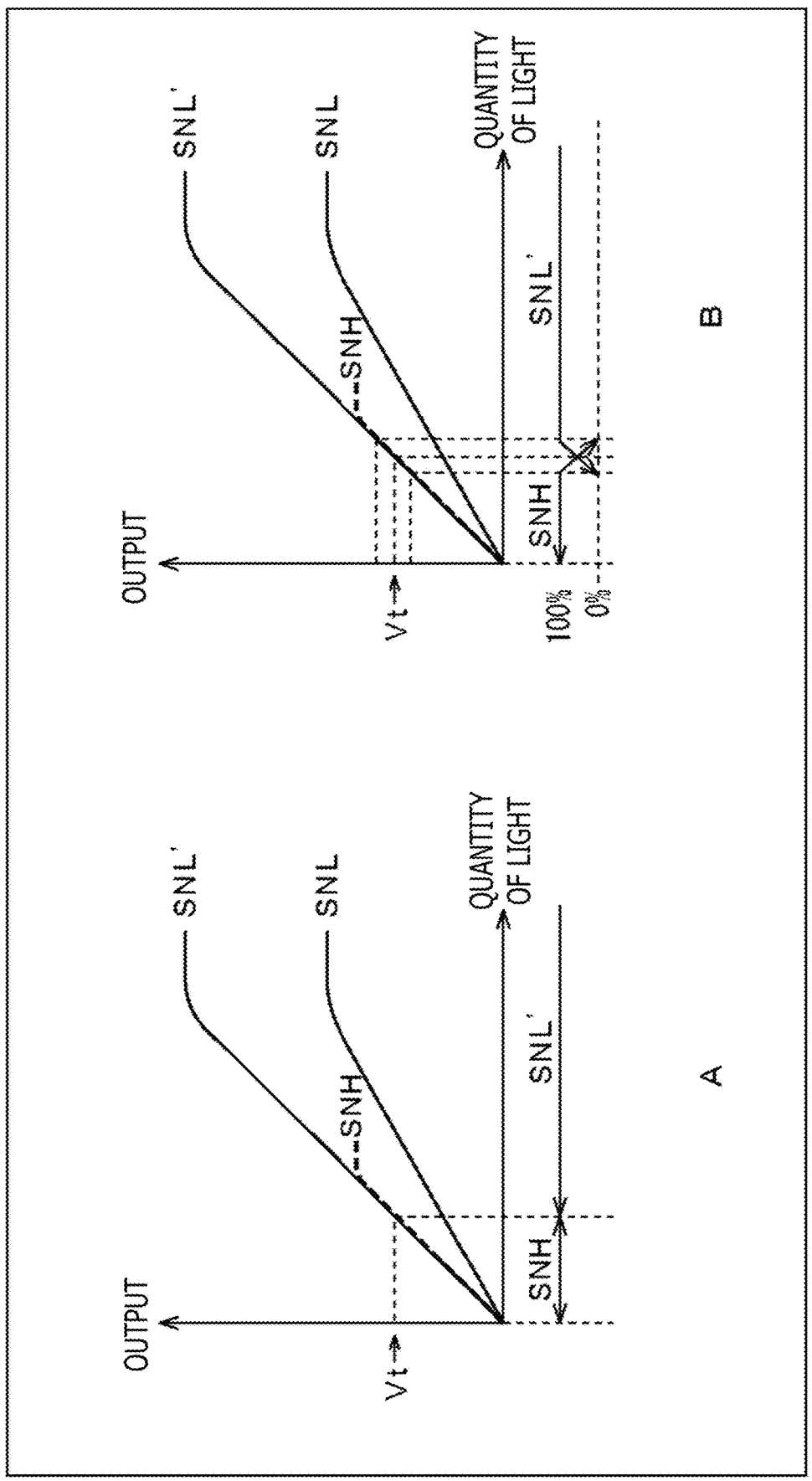
FIG. 27 is a characteristic diagram (part 2) of a quantity of incident light-output explaining signal processing.

Next, the signal processing portion 18, as depicted in A of FIG. 27, uses a predetermined threshold value Vt previously set. The threshold value Vt is previously set in an area before the high-sensitivity difference signal SNH is saturated in which the optical response characteristics are linear in the optical response characteristics.

Then, in a case where the high-sensitivity difference signal SNH does not exceed the predetermined threshold value Vt, the signal processing portion 18 outputs the high-sensitivity difference signal SNH concerned as the pixel signal SN of the processing target pixel. That is, in case of SNH<Vt, the pixel signal SN=the high-sensitivity difference signal SNH is obtained.

On the other hand, in a case where the high-sensitivity difference signal SNH exceeds the predetermined threshold value Vt, the signal processing portion 18 outputs the correction low-sensitivity difference signal SNL' of the low-sensitivity difference signal SNL as the pixel signal SN of the processing target pixel. That is, in case of Vt≤SNH, the pixel signal SN=the correction low-sensitivity difference signal SNL' is obtained.

(Processing Example 2 of Arithmetic Operation Processing for Pixel Signal)

Next, a description will be given with respect to a processing example 2 of arithmetic operation processing for the pixel signal.

Specifically, as depicted in B of FIG. 27, the signal processing portion 18 synthesizes the correction low-sensitivity difference signal SNL' and the high-sensitivity difference signal SNH with each other in a previously set ratio within a predetermined range of the high-sensitivity difference signal SNH, and outputs the synthetic signal as the pixel signal SN.

For example, the signal processing portion 18, as described below, changes the synthesis ratio of the correction low-sensitivity difference signal SNL' and the high-sensitivity difference signal SNH step by step with the predetermined threshold value Vt as a reference and in the anteroposterior range. The predetermined threshold value Vt is, as described above, the value previously set in the area, before the high-sensitivity difference signal SNH is saturated, in which the optical responsibility characteristics are linear in the optical responsibility characteristics.

In case of SNH<$Vt \times 0.90$, SN=SNH

In case of $Vt \times 0.90$<SNH<$Vt \times 0.94$, SN=0.9×SNH+ 0.1×SNL'

In case of $Vt \times 0.94$<SNH<$Vt \times 0.98$, SN=0.7×SNH+ 0.3×SNL'

In case of $Vt \times 0.98$<SNH<$Vt \times 1.02$, SN=0.5×SNH+ 0.5×SNL'

In case of $Vt \times 1.02$<SNH<$Vt \times 1.06$, SN=0.3×SNH+ 0.7×SNL'

In case of $Vt \times 1.06$<SNH<$Vt \times 1.10$, SN=0.1×SNH+ 0.9×SNL'

In case of $Vt \times 1.10$<SNH, SN=SNL'

It should be noted that since in the fourth and fifth embodiments, as described above, the capacitance at the time of reading out the high-sensitivity data signal SH and the high-sensitivity reset signal NH is variable, the value of the gain G in Expression (1) described above is changed depending on the value of the capacitance.

The arithmetic operation processing as described above is executed, resulting in that the signal can be more suitably switched from a signal at the time of low illuminance over to a signal as the time of high illuminance.

In addition, in the CMOS image sensors 10, 10A, and 10B, the electric charge accumulating portion 106 is provided in the low-sensitivity second photoelectric conversion portion 103, thereby enabling the level at which the low-sensitivity data signal SL is saturated to be increased. As a result, while a minimum value of the dynamic range is held, a maximum value of the dynamic range can be increased, and the dynamic range can be expanded.

For example, in an on-board image sensor, a phenomenon of LED flicker in which a flashing subject like an LED light source cannot be imaged at a flacking timing is caused in some causes. The reason why the LED flicker is caused is because, for example, the dynamic range of the past image sensor is low, and the exposure time needs to be changed every subject.

That is, for the purpose of coping with the subjects having various illuminations, with the past image sensor, for the subject having the low illuminance, the exposure time is lengthened, and for the subject having the high illuminance, the exposure time is shortened. As a result, even in the case of the low dynamic range, it becomes possible to cope with the subjects having the various illuminances. On the other hand, in a case where since the reading speed is constant irrespective of the exposure time, the exposure time is set with a unit shorter than the reading time, although the light made incident to the photoelectric conversion portion for a period of time other than the exposure time is subjected to the photoelectric conversion to be the electric charges, the resulting electric charges are discarded without reading.

On the other hand, with the CMOS image sensors 10, 10A and 10B as described above, the dynamic range can be expanded and the exposure time can be set long. Therefore, the generation of the LED flicker can be suppressed.

In addition, with the CMOS image sensors 10, 10A and 10B, it is possible to prevent the generation of the artifact or the reduction of the resolution caused in a case where the number of divisions is increased in accordance with the time-division system or the spatial-division system as described above.

9. Modified Changes

Although in the above description, there has been depicted the example in which two photoelectric conversion portions having the different sensitivities are provided within one pixel, three or more photoelectric conversion portions can be provided within one pixel. In this case, it is only necessary that the electric charge accumulating portion is not provided in the photoelectric conversion portion having the highest sensitivity, but the electric charge accumulating portion is provided at least in the photoelectric conversion portion having the lowest sensitivity. In addition, if this condition is fulfilled, then, two or more photoelectric conversion portions having the same sensitivity can also be provided.

In addition, although in the embodiments described above, the description has been given by exemplifying the case where the present technique is applied to the CMOS image sensor in which the unit pixels are arranged in a matrix, the present technique is by no means limited to the application to the CMOS image sensor. That is, the present technique can be applied to all the solid-state imaging devices each using the X-Y address system in which the unit pixels are two-dimensionally arranged in a matrix.

Moreover, the present technique can be applied not only to the solid-state imaging device for detecting a distribution of quantities of incident light of visible light to image the distribution as an image, but also to all the solid-state imaging devices for imaging infrared radiation, X-rays, or a distribution of incident quantities of particles or the like as an image.

It should be noted that the solid-state imaging device may have a form which is formed as one chip, or may have a module-shaped form which has an imaging function in which an imaging portion, and a signal processing portion or an optical system are collectively packaged.

In addition, in each of the timing charts of FIG. 5, FIG. 9, FIG. 15, and FIG. 23, the timings at which the drive signal TGL and the drive signal TGS are each turned ON are shifted from each other. Therefore, a part of the signal lines of both of them can be made common.

On the other hand, although in the timing charts of FIG. 15, FIG. 16, FIG. 18, FIG. 19, FIG. 23, and FIG. 24, there is depicted the example in which the periods of time for which the drive signal FDG and the drive signal FCG are each turned ON overlap each other, it is also possible to prevent the periods of time for which both the signals are each turned ON from overlapping each other. In other words, the timings at which the drive signal FDG and the drive signal FCG are each turned ON can also be shifted from each other. Then, the timings at which the drive signal FDG and the drive signal FCG are each turned ON are shifted from each other, thereby enabling a part of the signal lines of both of them to be made common.

Figure 28:
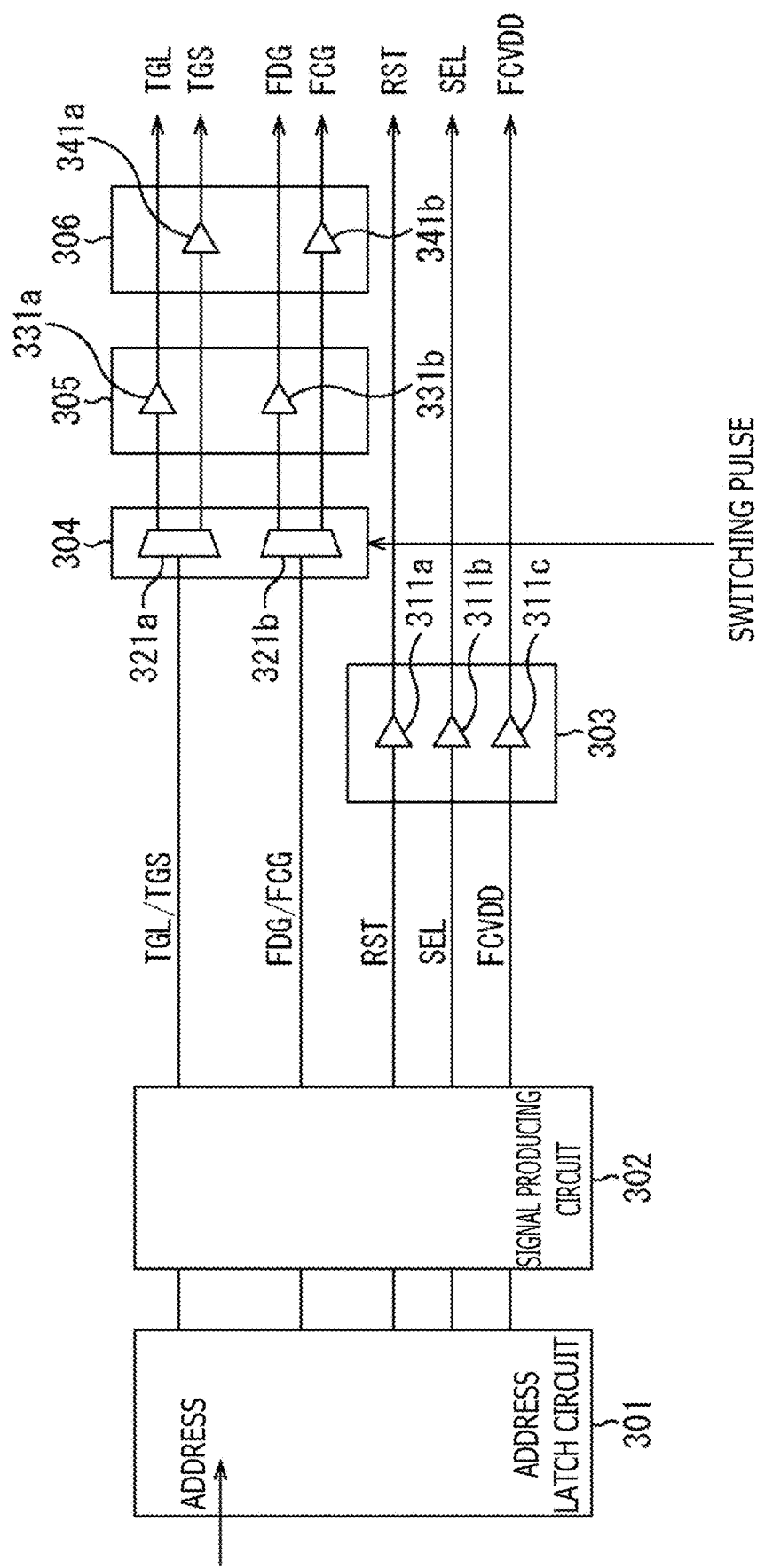
FIG. 28 is a block diagram depicting a part of an example of a configuration of a vertical drive portion of FIG. 1.

FIG. 28 depicts an example of a configuration of the vertical drive portion 12 of the CMOS image sensor 10 of FIG. 1 in a case where the timings at which the drive signal TGL and the drive signal TGS are each turned ON are shifted to each other, and the timings at which the drive signal FDG and the drive signal FCG are each turned ON are shifted to each other in the unit pixel 100G of FIG. 20. It should be noted that FIG. 28 depicts an example of a configuration for one row of the pixel array portion 11.

The vertical drive portion 12 includes an address latch circuit 301, a signal producing circuit 302, a drive portion 303, a switching portion 304, a drive portion 305, and a drive portion 306. The drive portion 303 includes amplifiers 311a to 311c. The switching portion 304 includes switching circuits 321a and 321b. The drive portion 305 includes amplifiers 331a and 331b. The drive portion 306 includes amplifiers 341a and 341b.

The address latch circuit 301 selects the row, in the pixel array portion 11, becoming the drive target on the basis of an address signal supplied from the system control portion 15.

The signal producing circuit 302 produces the drive signals TGL, TGS, FDG, FCG, RST, and SEL, and the power source voltage FCVDD which are supplied to the row selected by the address latch circuit 301.

It should be noted that since the timings at which the drive signal TGL and the drive signal TGS are turned ON are different from each other, the signal producing circuit 302 does not simultaneously produce both the drive signal TGL and the drive signal TGS, but produces both of them one after another at the different timings. Then, the signal producing circuit 302 supplies the drive signal TGL or the drive signal TGS to the switching circuit 321a through the common signal line.

In addition, since the timings at which the drive signal FDG and the drive signal FCG are turned ON are different from each other, the signal producing circuit 302 does not simultaneously produce both of the drive signal FDG and the drive signal FCG, but produces both of them one after another at the different timings. Then, the signal producing circuit 302 supplies the drive signal FDG or the drive signal FCG to the switching circuit 321b through the common signal line.

Moreover, the signal producing circuit 302 supplies the drive signals RST and SEL, and the power source voltage FCVDD to the amplifier 311a, the amplifier 311b, and the amplifier 311c through the different signal lines, respectively.

The amplifier 311a amplifies the drive signal RST, and supplies the resulting drive signal RST to the unit pixels 100G of the row becoming the drive target.

The amplifier 311b amplifies the drive signal SEL, and supplies the resulting drive signal SEL to the unit pixels 100G of the row becoming the drive target.

The amplifier 311c amplifies the power source voltage FCVDD, and supplies the resulting power source voltage FCVDD to the unit pixels 100G of the row becoming the drive target.

The switching circuit 321a selects the amplifier 331a of the drive portion 305 as a supply destination of the drive signal TGL on the basis of a switching pulse supplied from the system control portion 15, and supplies the drive signal TGL to the amplifier 331a. In addition, the switching circuit 321a selects the amplifier 341a of the drive portion 306 as a supply destination of the drive signal TGS on the basis of a switching pulse supplied from the system control portion 15, and supplies the drive signal TGS to the amplifier 341a. At this time, the drive signal TGL and the drive signal TGS are supplied to the amplifier 331a and the amplifier 341a through the different signal lines, respectively.

The switching circuit 321b selects the amplifier 331b of the drive portion 305 as a supply destination of the drive signal FDG on the basis of a switching pulse supplied from the system control portion 15, and supplies the drive signal FDG to the amplifier 331b. In addition, the switching circuit 321b selects the amplifier 341b of the drive portion 306 as a supply destination of the drive signal FCG on the basis of the switching pulse supplied from the system control portion 15, and supplies the drive signal FCG to the amplifier 341b. At this time, the drive signal FDG and the drive signal FCG are supplied to the amplifier 331b and the amplifier 341b through the different signal lines, respectively.

The amplifier 331a amplifies the drive signal TGL, and supplies the resulting drive signal TGL to the unit pixels 100G in the row becoming the drive target.

The amplifier 331b amplifies the drive signal TGS, and supplies the resulting drive signal TGS to the unit pixels 100G in the row becoming the drive target.

The amplifier 341*a* amplifies the drive signal FDG, and supplies the resulting drive signal FDG to the unit pixels 100G in the row becoming the drive target.

The amplifier 341*b* amplifies the drive signal FCG, and supplies the resulting drive signal FCG to the unit pixels 100G in the row becoming the drive target.

In such a way, the signal lines of the drive signal TGL and the drive signal TGS are made common, and the signal lines of the drive signal FDG and the drive signal FCG are made common between the signal producing circuit 302 and the switching circuit 321*a*, thereby enabling the number of signal lines to be reduced. As a result, in the unit pixel 100G, the increase in the area of the CMOS image sensor 10 resulting from the increase in the number of gate portions and transistors can be suppressed.

It should be noted that the signal line of only one of a combination of the drive signal TGL and the drive signal TGS, and a combination of the drive signal FDG and the drive signal FCG may be made common.

In addition, the embodiments described above can be combined with one another to the extent possible. For example, in the unit pixel 100A of FIG. 4, the unit pixel 100D of FIG. 11, and the unit pixel 100F of FIG. 17, the counter electrode of the electric charge accumulating portion 106 may be connected to the variable voltage power source FCVDD.

10. Examples of Use of Solid-State Imaging Device

Figure 29:
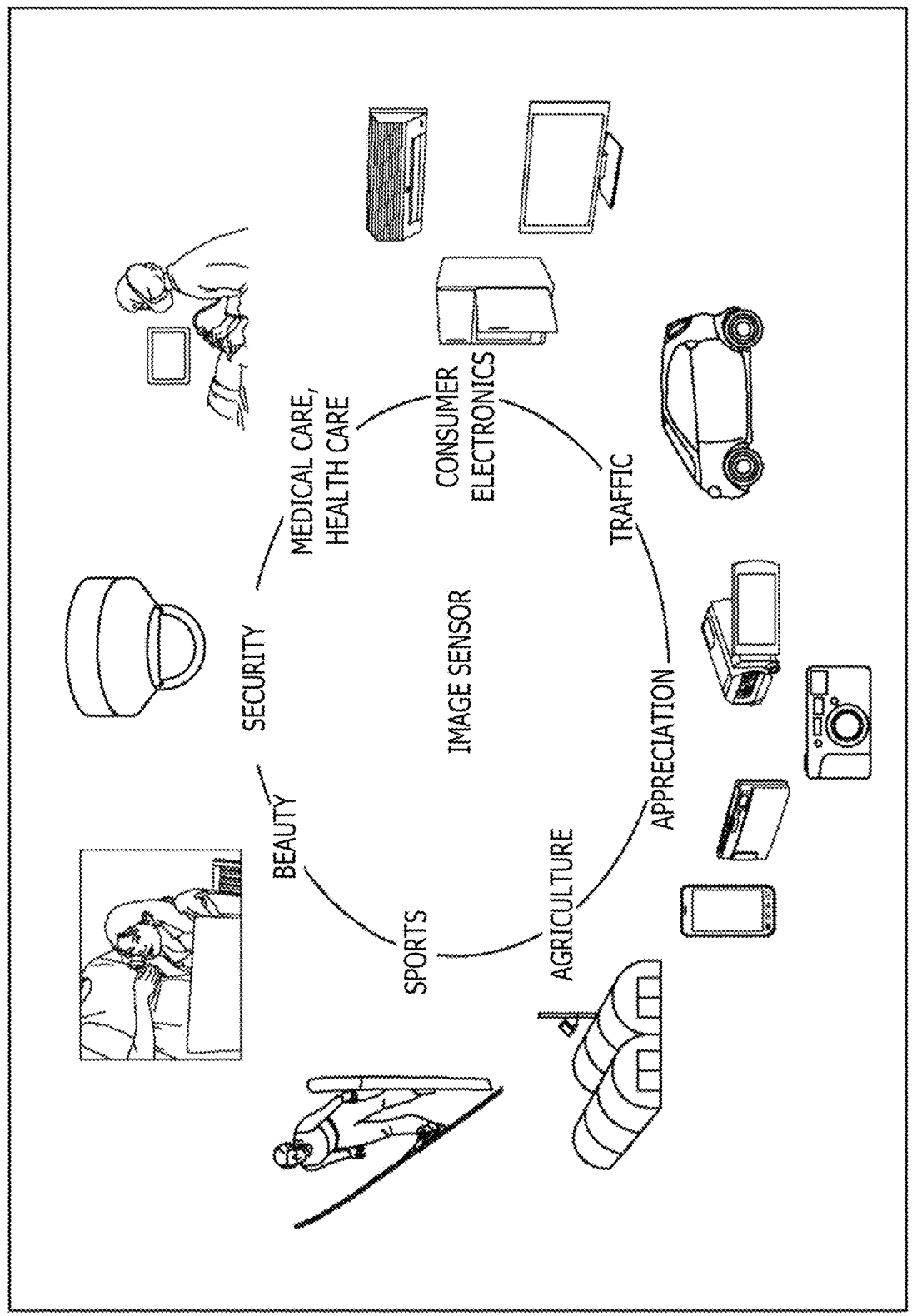
FIG. 29 is a view depicting examples of use of a solid-state imaging device.

FIG. 29 is a view depicting examples of use of the solid-state imaging device described above.

The solid-state imaging device described above, for example, can be used in such various cases as to sense the light such as visible light, infrared radiation, ultraviolet rays, and X-rays as will be described below.

- A device, for photographing an image for use in appreciation, such as a digital camera or a portable apparatus with a camera function
- A device, for use in traffic, such as an on-board sensor for photographing a front side, a rear side, a periphery, a car interior, or the like for safe driving such as automatic stop or recognition of a state of a driver, or the like, a monitoring camera for monitoring a road for a travelling vehicle, or a distance measuring sensor for measuring a distance between vehicles
- A device, for use in a consumer electronics, such as a TV, a refrigerator or an air conditioner, for imaging a gesture of a user to carry out an apparatus operation responding to the gesture
- A device, for use in medical care or health care, such as an endoscope, or a device for photographing a blood vessel by receiving infrared rays
- A device, for use in security, such as a monitoring camera for security applications, or a camera for person authentication applications
- A device, for use in beauty, such as a skin measuring instrument for photographing a skin, or a microscope for photographing a scalp
- A device, for sports, such as an action camera or a wearable camera for sport applications
- A device, for use in agriculture, such as a camera for monitoring a state of a field or crops {Imaging Apparatus}

Figure 30:
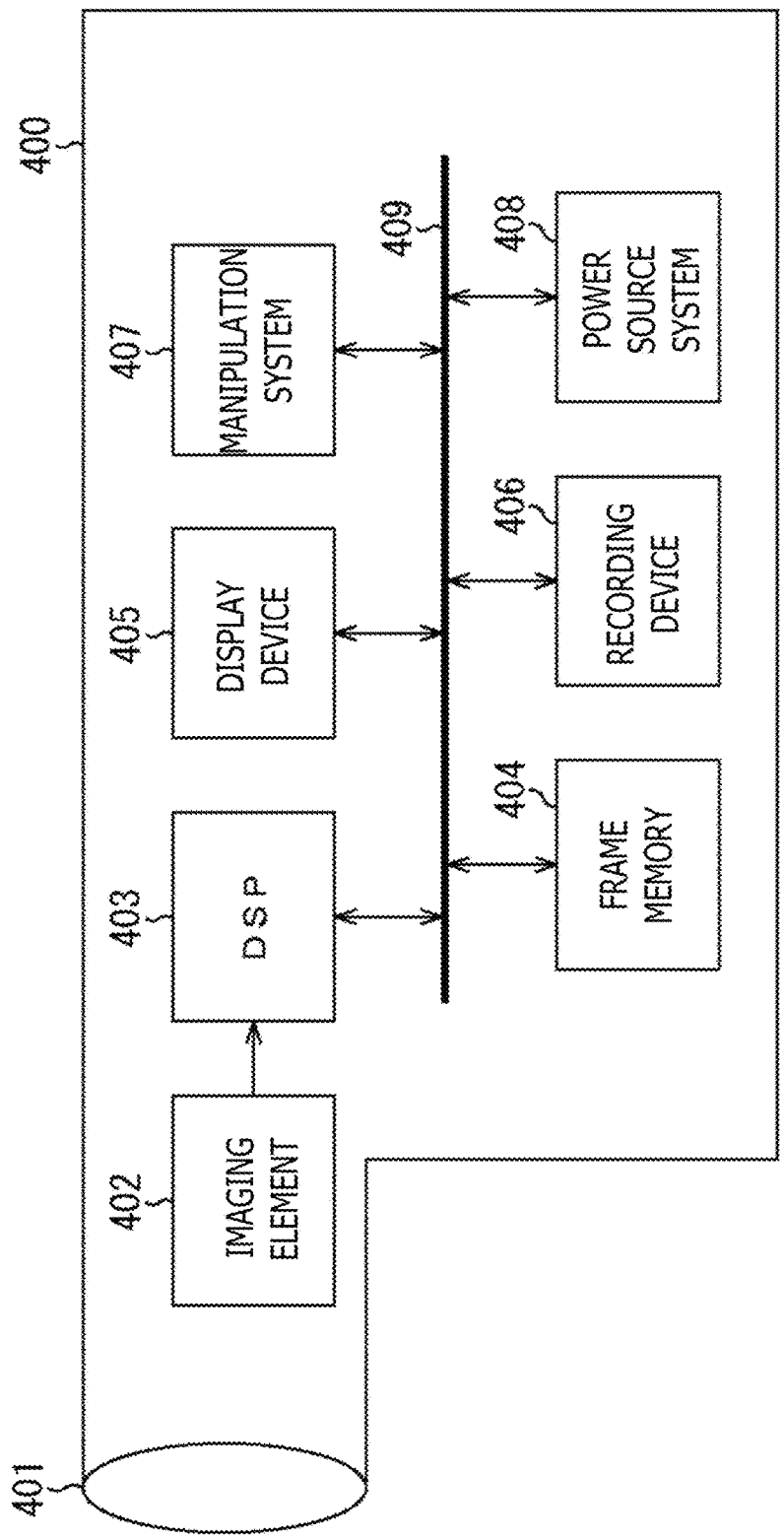
FIG. 30 is a block diagram depicting an example of a configuration of an electronic apparatus.

FIG. 30 is a block diagram depicting an example of a configuration of an imaging apparatus (camera apparatus) 400 as an example of an electronic apparatus to which the present technique is applied.

As depicted in FIG. 30, the imaging apparatus 400 has an optical system including a lens group 401 and the like, an imaging element 402, a DSP circuit 403 as a camera signal processing portion processing a signal from the imaging element 402, a frame memory 404, a display device 405, a recording device 406, a manipulation system 407, a power source system 408, and the like. Then, the imaging apparatus 400 adopts a configuration such that the DSP circuit 403, the frame memory 404, the display device 405, the recording device 406, the manipulation system 407, and the power source system 408 are connected to one another through a bus line 409.

The lens group 401 captures incident light (image light) from a subject to image the incident light on an imaging surface of the imaging element 402. The imaging element 402 converts a quantity of light imaged on the imaging surface by the lens group 401 into an electric signal in units of a pixel, and outputs the electric signal as a pixel signal.

The display device 405 includes a panel type display device such as a liquid crystal display device or an organic EL (electro luminescence) display device, and displays thereon a moving image or a still image captured by the imaging element 402. The reading device 406 records the moving image or the still image captured by the imaging element 402 in a recording medium such as a memory card, a video tape or a DVD (Digital Versatile Disk).

The manipulation system 407 issues manipulation instructions regarding various functions which the present imaging apparatus 400 has under the manipulation made by the user. The power source system 408 suitably supplies various kinds of power sources becoming operation power sources for the DSP circuit 403, the frame memory 404, the display device 405, the recording device 406, and the manipulation system 407 to these supply targets.

Such an imaging apparatus 400 is applied to a video camera or a digital still camera, and moreover, a camera module for a mobile apparatus such as a smartphone or mobile phone. Then, in this imaging apparatus 400, the solid-state imaging devices pertaining to the embodiments described above can be each used as the imaging element 402. As a result, the image quality in the imaging apparatus 400 can be enhanced.

It should be noted that the embodiments of the present techniques are by no means limited to these embodiments described above, and various changes can be made without departing from the subject matter of the present technique.

For example, the embodiments described above can be combined with one another to the extent possible. For example, the third to fifth embodiments described above can be combined with the second embodiment.

In addition, for example, the present technique can also adopt the following constitutions.

(1)

A solid-state imaging device, including:
a pixel array portion in which a plurality of unit pixels are arranged; and
a drive portion configured to control an operation of the unit pixel;
the unit pixel including
a first photoelectric conversion portion,
a second photoelectric conversion portion a sensitivity of which is lower than that of the first photoelectric conversion portion, an electric charge accumulating portion configured to accumulate electric charges produced by the second photoelectric conversion portion, a counter electrode of the electric charge accumulating portion being connected to a variable voltage power source, a charge-to-voltage conversion portion, a first transfer gate portion configured to transfer the electric charges from the first photoelectric conversion portion to the charge-to-voltage conversion portion, and a second transfer gate portion configured to couple potentials of the charge-to-voltage conversion portion and the electric charge accumulating portion to each other;

for at least a part of a period of time for which the electric charges produced by the second photoelectric conversion portion are accumulated in the electric charge accumulating portion, the drive portion causing a voltage of the variable voltage power source to be lower than that when a signal based on the electric charges accumulated in the electric charge accumulating portion is read out.

(2)

The solid-state imaging device according to (1) described above, in which the variable voltage power source can be set to a first voltage and a second voltage lower than the first voltage, and outputs the first voltage through a low-pass filter.

(3)

The solid-state imaging device according to (2) described above, in which the low-pass filter includes a resistor within a chip in which the solid-state imaging device is provided, and a capacitor mounted to an outside of the chip.

(4)

The solid-state imaging device according to (1) described above, in which the variable voltage power source can be set to a first voltage and a second voltage lower than the first voltage, and outputs the first voltage through a sample-and-hold circuit.

(5)

The solid-state imaging device according to (4) described above, in which the sample-and-hold circuit includes a switch within a chip in which the solid-state imaging device is provided, and a capacitor mounted to an outside of the chip.

(6)

The solid-state imaging device according to any one of (1) to (5) described above, in which the unit pixel further includes a third transfer gate portion configured to transfer the electric charges from the second photoelectric conversion portion to the electric charge accumulating portion, and an overflow path transferring the electric charges overflowing from the second photoelectric conversion portion to the electric charge accumulating portion, the overflow path being formed in a lower portion of a gate electrode of the third transfer gate portion.

(7)

The solid-state imaging device according to (6) described above, in which the drive portion includes a signal producing portion configured to produce a gate signal for the first transfer gate portion, and a gate signal for the third transfer gate portion, and output any one of these gate signals to a common first signal line, and a switching portion configured to output the gate signal of the first transfer gate portion inputted through the first signal line to a second signal line, and output the gate signal of the third transfer gate portion inputted through the first signal line to a third signal line.

(8)

The solid-state imaging device according to any one of (1) to (5) described above, in which the second photoelectric conversion portion and the electric charge accumulating portion are connected to each other without going through a transfer gate portion.

(9)

The solid-state imaging device according to any one of (1) to (8) described above, in which the unit pixel further includes a fourth transfer gate portion connected between the second transfer gate portion and the charge-to-voltage conversion portion.

(10)

The solid-state imaging device according to (9) described above, in which the drive portion includes a signal producing portion configured to produce a gate signal for the second transfer gate portion and a gate signal for the fourth transfer gate portion, and output any one of these gate signals to a common fourth signal line, and a switching portion configured to output the gate signal for the second transfer gate portion inputted through the fourth signal line to a fifth signal line, and output the gate signal for the fourth transfer gate portion inputted through the fourth signal line to a sixth signal line.

(11)

The solid-state imaging device according to any one of (1) to (10) described above, in which in a case where a first data signal based on the electric charges produced by the first photoelectric conversion portion is read out, the drive portion causes the second transfer gate portion to be in a non-conduction state and in a case where a second data signal based on the electric charges produced by the second photoelectric conversion portion is read out, the drive portion causes the second transfer gate portion to be in a conduction state.

(12)

The solid-state imaging device according to (11) described above, in which the drive portion makes control in such a way that in a case where the first data signal is read out, after a first reset signal is read out in a state in which the charge-to-voltage conversion portion is reset, the first data signal is read out, and in a case where the second data signal is read out, after the second data signal is read out, a second reset signal is read out in a state in which an area in which the potentials of the charge-to-voltage conversion portion and the electric charge accumulating portion are coupled to each other is reset.

(13)

The solid-state imaging device according to (12) described above, further including:

a signal processing portion configured to produce a first difference signal as a difference between the first data signal and the first reset signal, and a second difference signal as a difference between the second data signal and the second reset signal, use the first difference signal as a pixel signal of the unit pixel in a case where a value of the first difference signal is equal to or smaller than a predetermined threshold value, and use the second difference signal as the pixel signal of the unit pixel in a case where the value of the first difference signal exceeds the threshold value.

(14)

The solid-state imaging device according to (12) described above, further including:
  a signal processing portion configured to produce a first difference signal as a difference between the first data signal and the first reset signal, and a second difference signal as a difference between the second data signal and the second reset signal, and synthesize the first difference signal and the second difference signal in a synthesis ratio set on a basis of a value of the first difference signal, thereby producing a pixel signal of the unit pixel.

(15)

A method of driving a solid-state imaging device including a pixel array portion in which a plurality of unit pixels are arranged, the unit pixel including
  a first photoelectric conversion portion,
  a second photoelectric conversion portion a sensitivity of which is lower than that of the first photoelectric conversion portion,
  an electric charge accumulating portion configured to accumulate electric charges produced by the second photoelectric conversion portion, a counter electrode of the electric charge accumulating portion being connected to a variable voltage power source,
  a charge-to-voltage conversion portion,
  a first transfer gate portion configured to transfer the electric charges from the first photoelectric conversion portion to the charge-to-voltage conversion portion, and
  a second transfer gate portion configured to couple potentials of the charge-to-voltage conversion portion and the electric charge accumulating portion to each other,
  the method including:
    by the solid-state imaging device, for at least a part of a period of time for which the electric charges produced by the second photoelectric conversion portion are accumulated in the electric charge accumulating portion, causing a voltage of the variable voltage power source to be lower than that when a signal based on the electric charges accumulated in the electric charge accumulating portion is read out.

(16)

An electronic apparatus, including:
  a solid-state imaging device including
  a pixel array portion in which a plurality of unit pixels are arranged, and
  a drive portion configured to control an operation of the unit pixel,
  the unit pixel including
    a first photoelectric conversion portion,
    a second photoelectric conversion portion a sensitivity of which is lower than that of the first photoelectric conversion portion,
    an electric charge accumulating portion configured to accumulate electric charges produced by the second photoelectric conversion portion, a counter electrode of the electric charge accumulating portion being connected to a variable voltage power source,
    a charge-to-voltage conversion portion,
    a first transfer gate portion configured to transfer the electric charges from the first photoelectric conversion portion to the charge-to-voltage conversion portion, and
    a second transfer gate portion configured to couple potentials of the charge-to-voltage conversion portion and the electric charge accumulating portion to each other,
  for at least a part of a period of time for which the electric charges produced by the second photoelectric conversion portion are accumulated in the electric charge accumulating portion, the drive portion causing a voltage of the variable voltage power source to be lower than that when a signal based on the electric charges accumulated in the electric charge accumulating portion is read out; and
  a signal processing portion configured to process a signal from the solid-state imaging device.

REFERENCE SIGNS LIST 10, 10A, 10B . . . CMOS image sensor, 11 . . . Pixel array portion, 12 . . . Vertical drive portion, 13 . . . Column processing portion, 14 . . . Horizontal drive portion, 15 . . . System control portion, 16 . . . Pixel drive line, 17 . . . Vertical signal line, 18 . . . Signal processing portion, 19 . . . Data storing portion, 100A to 100F . . . Unit pixel, 101 . . . First photoelectric conversion portion, 102 . . . First transfer gate portion, 103 . . . Second photoelectric conversion portion, 104 . . . Second transfer gate portion, 105 . . . Third transfer gate portion, 106 . . . Electric charge accumulating portion, 107 . . . Reset gate portion, 108 . . . FD portion, 109 . . . Amplification transistor, 110 . . . Selection transistor, 151 . . . Fourth transfer gate portion, 152 . . . Node, 201 . . . Resistor, 202 . . . Capacitor, 211 . . . Switch, 212 . . . Capacitor, 302 . . . Signal producing circuit, 304 . . . Switching portion, 321a, 321b . . . Switching circuit, 400 . . . Imaging device, 402 . . . Imaging element

The invention claimed is:

1. A solid-state imaging device, comprising:
  a pixel array portion in which a plurality of unit pixels are arranged; and
  a drive portion configured to control an operation of each of the unit pixels,
  wherein each of the unit pixels includes:
    a first photoelectric conversion portion,
    a second photoelectric conversion portion a sensitivity of which is lower than that of the first photoelectric conversion portion,
    an electric charge accumulating portion configured to accumulate electric charges produced by the second photoelectric conversion portion, a counter electrode of the electric charge accumulating portion being connected to a variable voltage power source that is settable to a voltage that includes a first voltage and a second voltage lower than the first voltage,
    a charge-to-voltage conversion portion,
    a first transfer gate portion configured to transfer the electric charges from the first photoelectric conversion portion to the charge-to-voltage conversion portion,
    a second transfer gate portion configured to couple potentials of the charge-to-voltage conversion portion and the electric charge accumulating portion to each other, and
    noise-reduction circuitry configured to reject high-frequency noise from the first voltage of the variable voltage power source, and
  wherein, for at least a part of a period of time for which the electric charges produced by the second photoelectric conversion portion are accumulated in the electric charge accumulating portion, the drive portion causes the voltage of the variable voltage power source to be lower than that when a signal based on the electric charges accumulated in the electric charge accumulating portion is read out.

2. The solid-state imaging device according to claim 1, wherein the variable voltage power source outputs the first voltage through a low-pass filter comprising the noise-reduction circuitry.

3. The solid-state imaging device according to claim 2, wherein the low-pass filter includes a resistor within a chip in which the solid-state imaging device is provided, and a capacitor mounted to an outside of the chip.

4. The solid-state imaging device according to claim 1, wherein the variable voltage power source outputs the first voltage through a sample-and-hold circuit comprising the noise-reduction circuitry.

5. The solid-state imaging device according to claim 4, wherein the sample-and-hold circuit includes a switch within a chip in which the solid-state imaging device is provided, and a capacitor mounted to an outside of the chip.

6. The solid-state imaging device according to claim 1, wherein the unit pixel further includes
   a third transfer gate portion configured to transfer the electric charges from the second photoelectric conversion portion to the electric charge accumulating portion, and
   an overflow path transferring the electric charges overflowing from the second photoelectric conversion portion to the electric charge accumulating portion, the overflow path being formed in a lower portion of a gate electrode of the third transfer gate portion.

7. The solid-state imaging device according to claim 6, wherein the drive portion includes
   a signal producing portion configured to produce a gate signal for the first transfer gate portion, and a gate signal for the third transfer gate portion, and output any one of these gate signals to a common first signal line, and
   a switching portion configured to output the gate signal of the first transfer gate portion inputted through the first signal line to a second signal line, and output the gate signal of the third transfer gate portion inputted through the first signal line to a third signal line.

8. The solid-state imaging device according to claim 1, wherein the second photoelectric conversion portion and the electric charge accumulating portion are connected to each other without going through a transfer gate portion.

9. The solid-state imaging device according to claim 1, wherein the unit pixel further includes a fourth transfer gate portion connected between the second transfer gate portion and the charge-to-voltage conversion portion.

10. The solid-state imaging device according to claim 9, wherein the drive portion includes
    a signal producing portion configured to produce a gate signal for the second transfer gate portion and a gate signal for the fourth transfer gate portion, and output any one of these gate signals to a common fourth signal line, and
    a switching portion configured to output the gate signal for the second transfer gate portion inputted through the fourth signal line to a fifth signal line, and output the gate signal for the fourth transfer gate portion inputted through the fourth signal line to a sixth signal line.

11. The solid-state imaging device according to claim 1, wherein in a case where a first data signal based on the electric charges produced by the first photoelectric conversion portion is read out, the drive portion causes the second transfer gate portion to be in a non-conduction state and in a case where a second data signal based on the electric charges produced by the second photoelectric conversion portion is read out, the drive portion causes the second transfer gate portion to be in a conduction state.

12. The solid-state imaging device according to claim 11, wherein the drive portion makes control in such a way that in a case where the first data signal is read out, after a first reset signal is read out in a state in which the charge-to-voltage conversion portion is reset, the first data signal is read out, and in a case where the second data signal is read out, after the second data signal is read out, a second reset signal is read out in a state in which an area in which the potentials of the charge-to-voltage conversion portion and the electric charge accumulating portion are coupled to each other is reset.

13. The solid-state imaging device according to claim 12, further comprising:
    a signal processing portion configured to produce a first difference signal as a difference between the first data signal and the first reset signal, and a second difference signal as a difference between the second data signal and the second reset signal, use the first difference signal as a pixel signal of the unit pixel in a case where a value of the first difference signal is equal to or smaller than a predetermined threshold value, and use the second difference signal as the pixel signal of the unit pixel in a case where the value of the first difference signal exceeds the threshold value.

14. The solid-state imaging device according to claim 12, further comprising:
    a signal processing portion configured to produce a first difference signal as a difference between the first data signal and the first reset signal, and a second difference signal as a difference between the second data signal and the second reset signal, and synthesize the first difference signal and the second difference signal in a synthesis ratio set on a basis of a value of the first difference signal, thereby producing a pixel signal of the unit pixel.

15. A method of driving a solid-state imaging device including a pixel array portion in which a plurality of unit pixels are arranged, each of the unit pixels including: a first photoelectric conversion portion, a second photoelectric conversion portion a sensitivity of which is lower than that of the first photoelectric conversion portion, an electric charge accumulating portion configured to accumulate electric charges produced by the second photoelectric conversion portion, a charge-to-voltage conversion portion, a first transfer gate portion configured to transfer the electric charges from the first photoelectric conversion portion to the charge-to-voltage conversion portion, a second transfer gate portion configured to couple potentials of the charge-to-voltage conversion portion and the electric charge accumulating portion to each other, and noise-reduction circuitry, wherein a counter electrode of the electric charge accumulating portion is connected to a variable voltage power source that is settable to a voltage that includes a first voltage and a second voltage lower than the first voltage, the method comprising:
    using the noise-reduction circuitry to reject high-frequency noise from the first voltage of the variable voltage power source; and
    for at least a part of a period of time for which the electric charges produced by the second photoelectric conversion portion are accumulated in the electric charge accumulating portion, causing the voltage of the variable voltage power source to be lower than that when a signal based on the electric charges accumulated in the electric charge accumulating portion is read out.

16. An electronic apparatus, comprising:
   a solid-state imaging device including
      a pixel array portion in which a plurality of unit pixels are arranged, and
      a drive portion configured to control an operation of each of the unit pixels,
      wherein each of the unit pixels includes:
         a first photoelectric conversion portion,
         a second photoelectric conversion portion a sensitivity of which is lower than that of the first photoelectric conversion portion,
         an electric charge accumulating portion configured to accumulate electric charges produced by the second photoelectric conversion portion, a counter electrode of the electric charge accumulating portion being connected to a variable voltage power source that is settable to a voltage that includes a first voltage and a second voltage lower than the first voltage,
         a charge-to-voltage conversion portion,
         a first transfer gate portion configured to transfer the electric charges from the first photoelectric conversion portion to the charge-to-voltage conversion portion,
         a second transfer gate portion configured to couple potentials of the charge-to-voltage conversion portion and the electric charge accumulating portion to each other, and
         noise-reduction circuitry configured to reject high-frequency noise from the first voltage of the variable voltage power source, and
      wherein, for at least a part of a period of time for which the electric charges produced by the second photoelectric conversion portion are accumulated in the electric charge accumulating portion, the drive portion causes the voltage of the variable voltage power source to be lower than that when a signal based on the electric charges accumulated in the electric charge accumulating portion is read out; and
   a signal processing portion configured to process a signal from the solid-state imaging device.

* * * * *